(12) United States Patent
Tay

(10) Patent No.: US 8,866,945 B2
(45) Date of Patent: Oct. 21, 2014

(54) COLOR IMAGE SAMPLING AND RECONSTRUCTION

(76) Inventor: Hiok Nam Tay, Singapore (SG)

(*) Notice: Subject to any disclaimer, the term of this patent is extended or adjusted under 35 U.S.C. 154(b) by 163 days.

(21) Appl. No.: 13/244,336

(22) Filed: Sep. 24, 2011

(65) Prior Publication Data

US 2012/0075511 A1  Mar. 29, 2012

Related U.S. Application Data

(60) Provisional application No. 61/392,069, filed on Oct. 12, 2010, provisional application No. 61/386,533, filed on Sep. 26, 2010.

(51) Int. Cl.
| | | |
|---|---|---|
| H04N 9/083 | (2006.01) | |
| H01L 27/146 | (2006.01) | |
| H04N 9/04 | (2006.01) | |

(52) U.S. Cl.
CPC .... *H01L 27/14621* (2013.01); *H01L 27/14689* (2013.01); *H01L 27/1461* (2013.01); *H01L 27/14647* (2013.01); *H04N 9/045* (2013.01); *H04N 2209/047* (2013.01)
USPC ............ 348/280; 348/272; 348/278; 348/274

(58) Field of Classification Search
USPC .......................... 348/271–281, 294, 241, 246
See application file for complete search history.

(56) References Cited

U.S. PATENT DOCUMENTS

| | | | | |
|---|---|---|---|---|
| 4,437,112 | A * | 3/1984 | Tanaka et al. | 348/279 |
| 6,534,759 | B1 | 3/2003 | Koscielniak | |
| 6,956,273 | B2 * | 10/2005 | Koizumi | 257/440 |
| 7,283,164 | B2 * | 10/2007 | Kakarala et al. | 348/246 |
| 7,554,587 | B2 * | 6/2009 | Shizukuishi | 348/272 |
| 2004/0051798 | A1 * | 3/2004 | Kakarala et al. | 348/246 |
| 2004/0178478 | A1 * | 9/2004 | Shizukuishi | 257/620 |
| 2009/0152604 | A1 | 6/2009 | Zhu | |
| 2009/0160981 | A1 | 6/2009 | Baumgartner et al. | |
| 2009/0200584 | A1 | 8/2009 | Tweet et al. | |

OTHER PUBLICATIONS

PCT/IB2011/054213 International Search Report.
PCT/IB2011/054213 Written Opinion.

* cited by examiner

*Primary Examiner* — Ahmed A Berhan

(57) ABSTRACT

An image capture apparatus that includes an array of color filters for green, red, and magenta colors arranged over a semiconductor substrate in the manner of a primary color Bayer pattern except a magenta color replaces the blue color. Light passing through the magenta color filter is integrated separately in a magenta pixel for a shallow photodiode signal and a deep photodiode signal in a first photodiode and a deeper second photodiode in the substrate, respectively. A mezzanine photodiode may be disposed between the first and second photodiodes and held at a fixed voltage level or reset multiple times during charge integration. A red pixel value for the magenta pixel is a function of the deep photodiode signal and an adjacent red pixel's red pixel signal. A minimum exists in its derivative with respect to the former at a value of the former that varies with the latter.

16 Claims, 20 Drawing Sheets

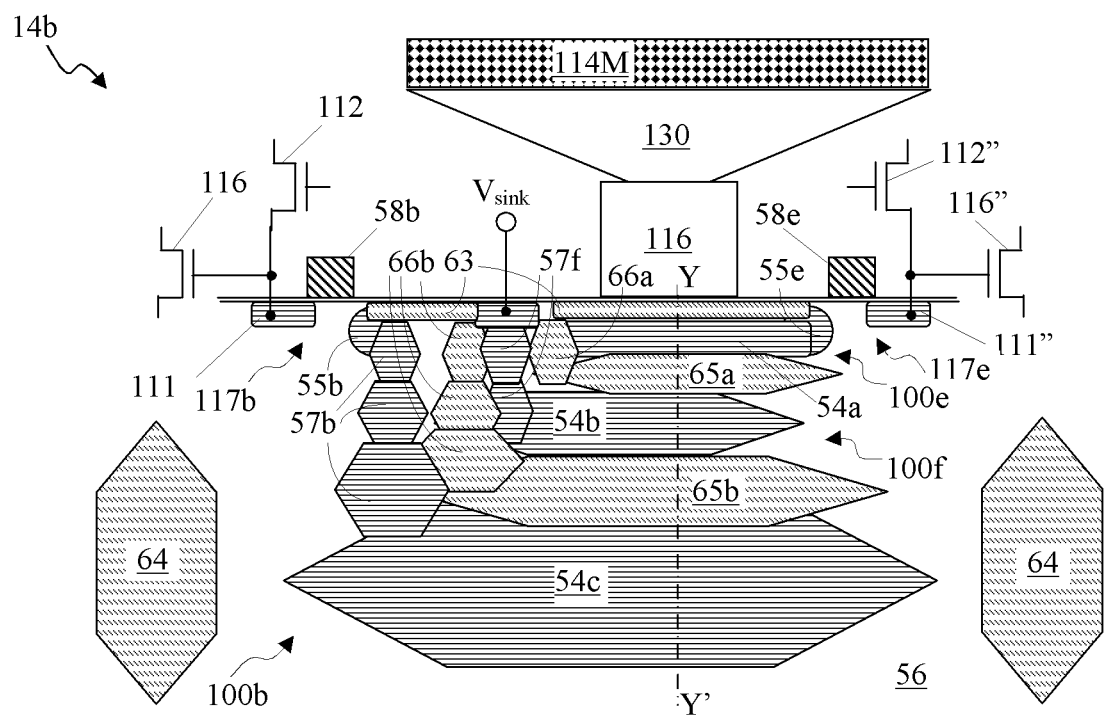
FIG. 8
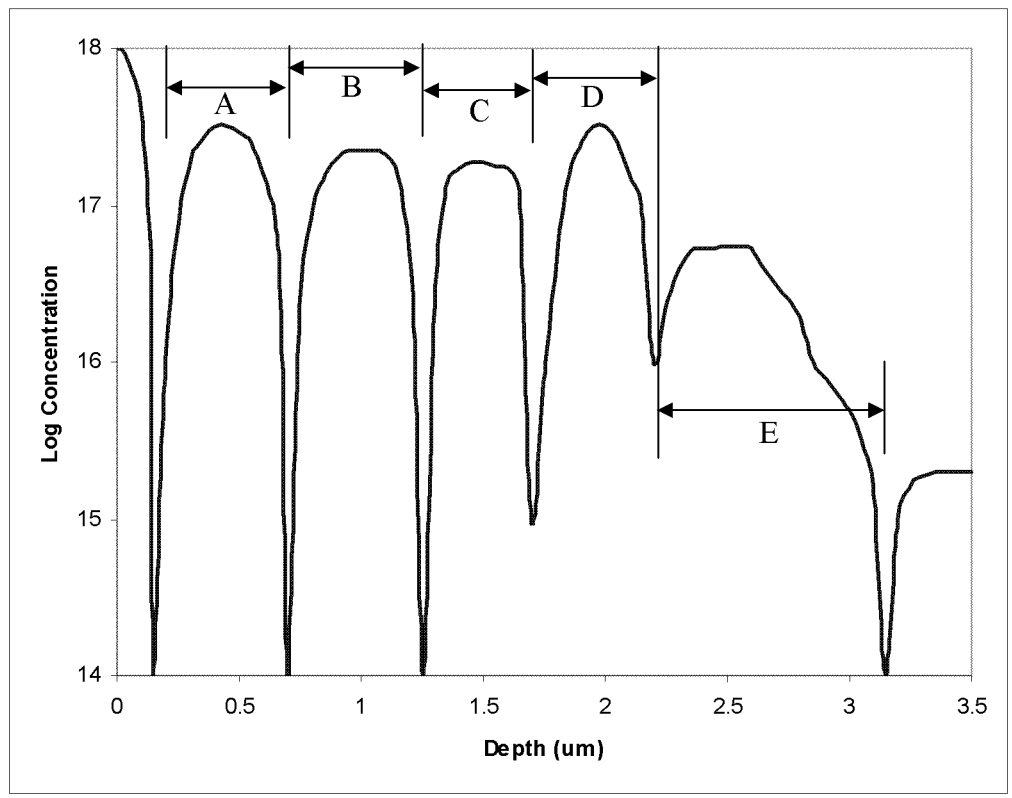
FIG. 9 (Doping Profile)

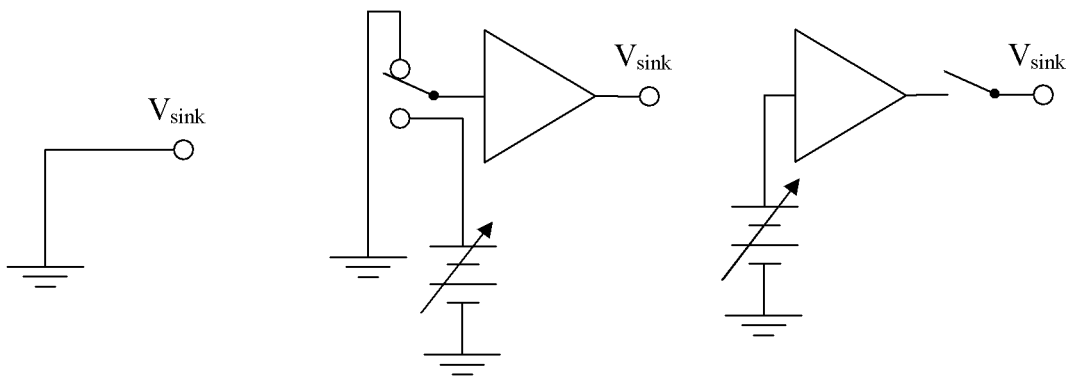
*FIG. 10A*          *FIG. 10B*          *FIG. 10C*
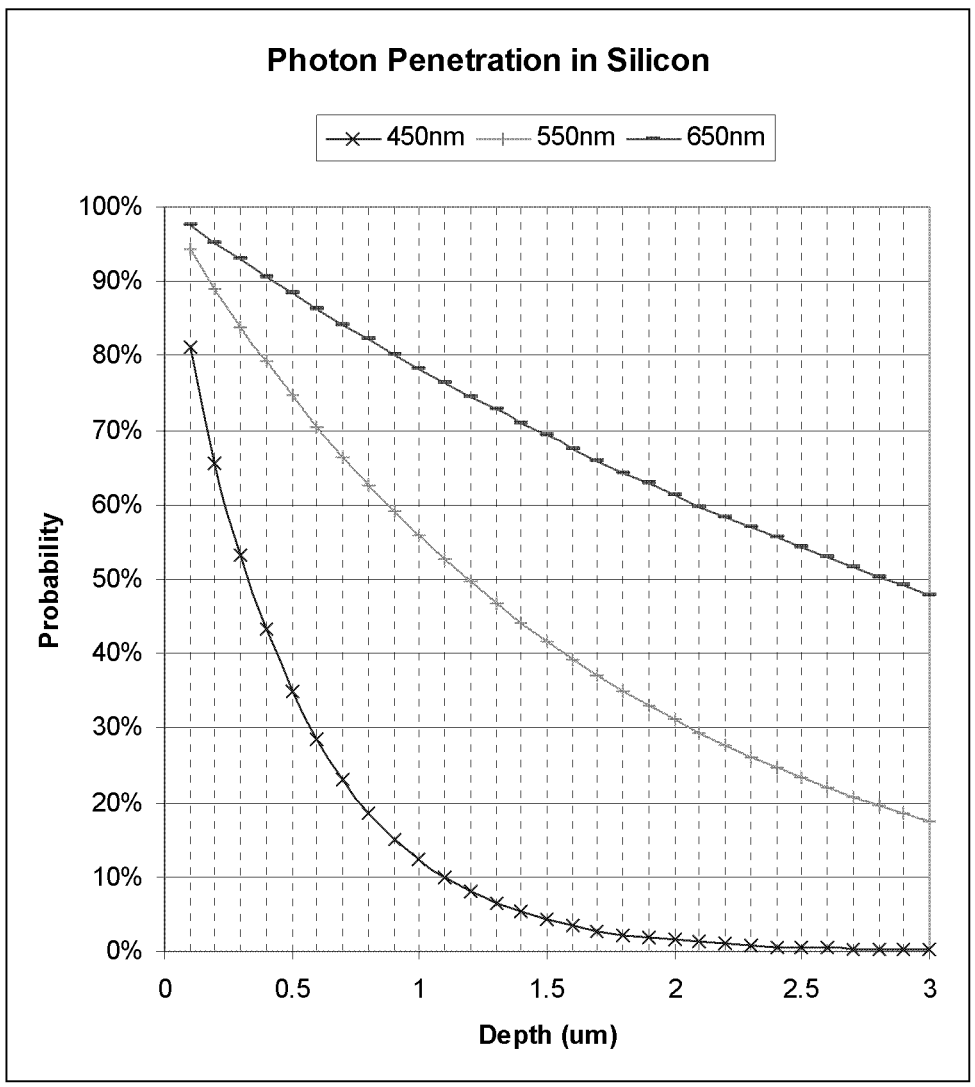
*FIG. 11*

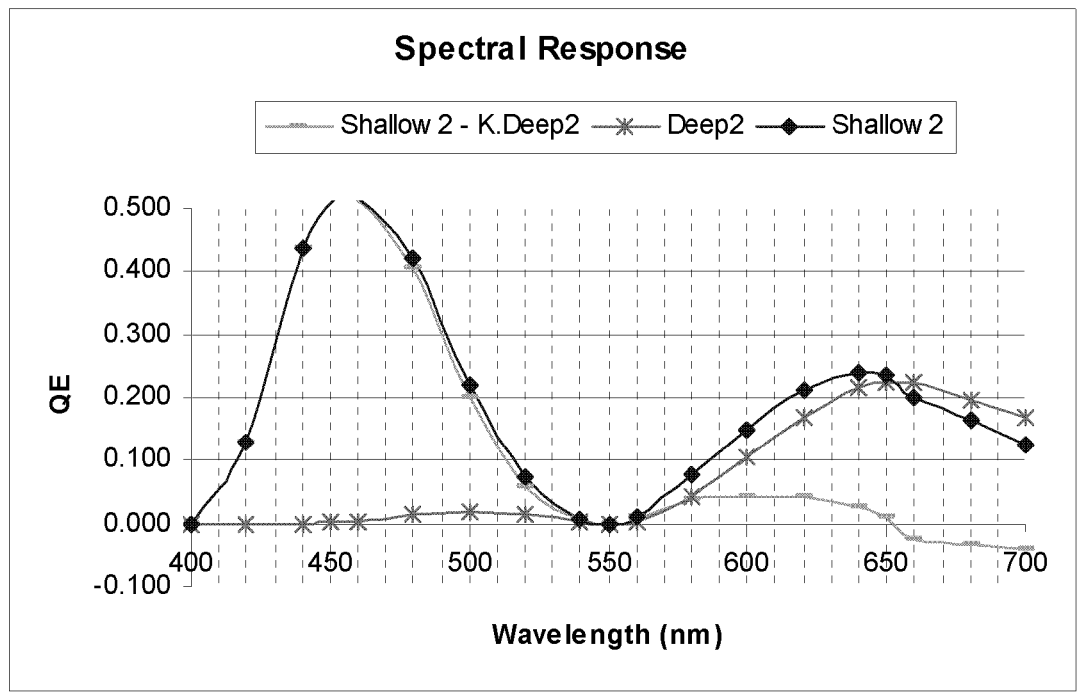
FIG. 16
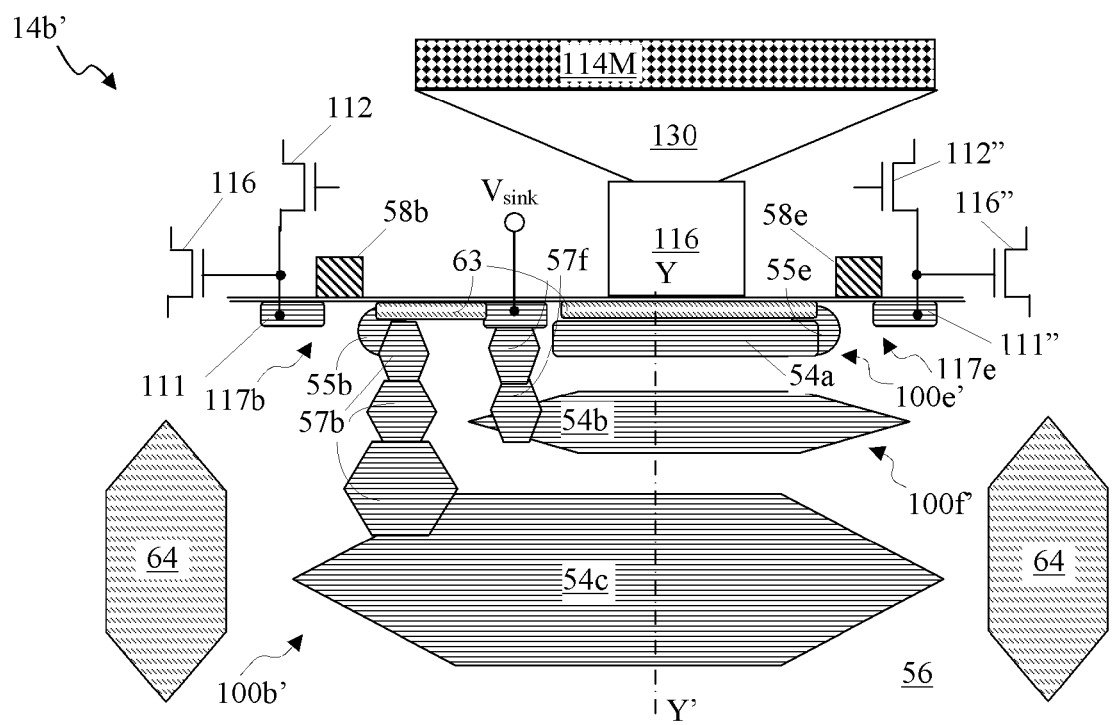
FIG. 17 (Magenta Pixel, 2nd embodiment)

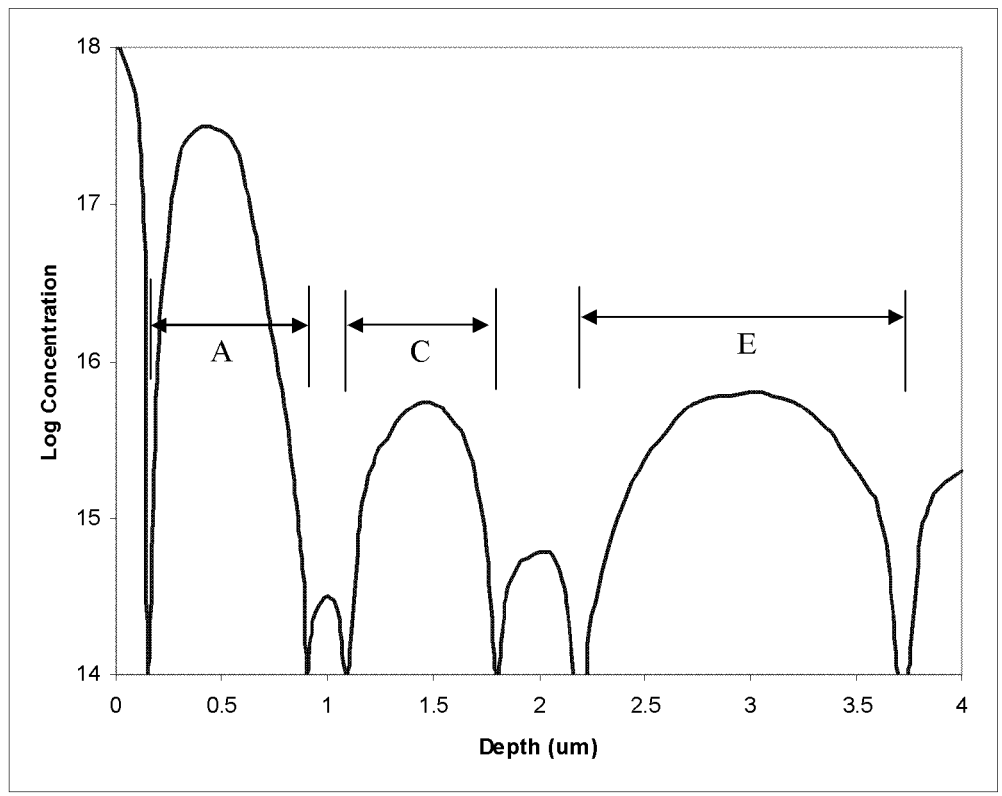
FIG. 18 (Doping profile, 2nd embodiment)
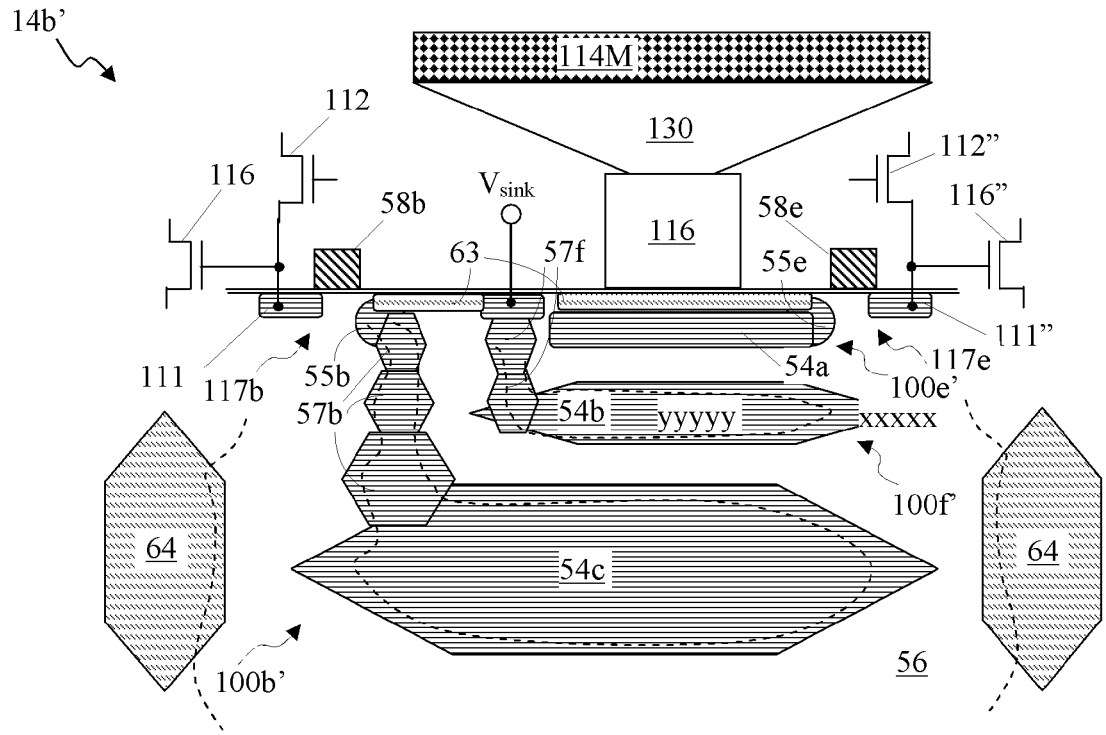
FIG. 19 (Depletion Regions Pinched)

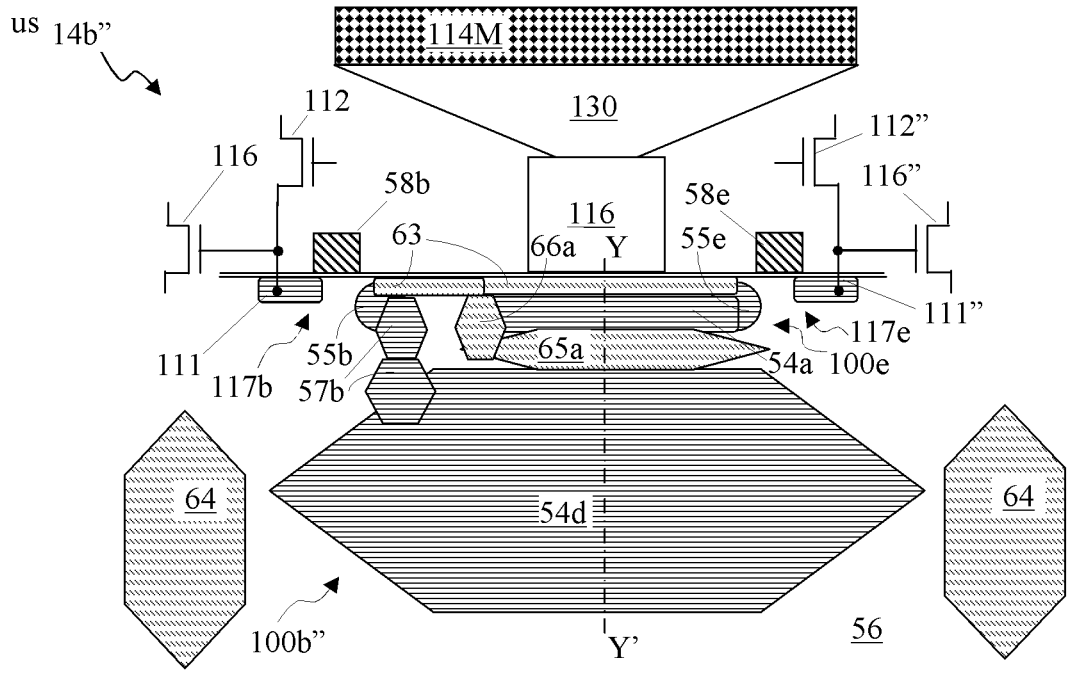
FIG. 20 (Magenta Pixel, 3$^{rd}$ embodiment)
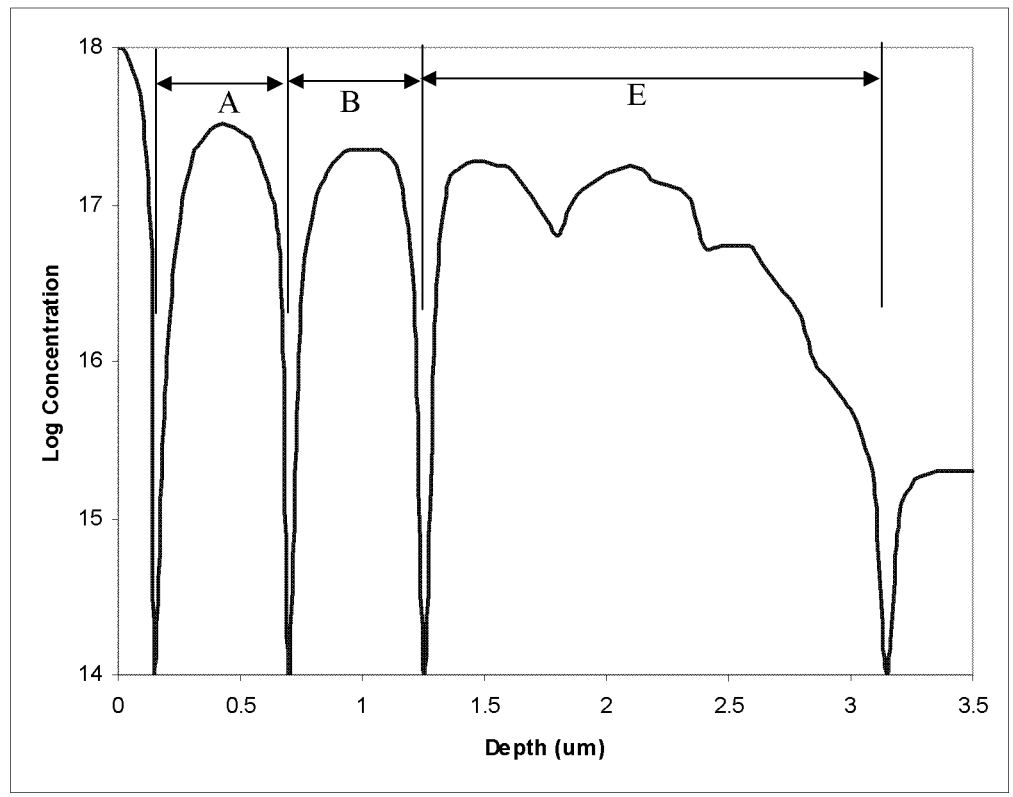
FIG. 21 (Doping profile, 3rd embodiment)

US 8,866,945 B2

COLOR IMAGE SAMPLING AND RECONSTRUCTION

REFERENCE TO CROSS-RELATED APPLICATIONS

This application claims priority to U.S. Provisional Patent Application No. 61/386,533 filed on Sep. 26, 2010 and U.S. Provisional Patent Application No. 61/392,069, filed on Oct. 12, 2010.

BACKGROUND OF THE INVENTION

1. Field of the Invention

The subject matter disclosed, generally relates to structures and methods for sampling color images on solid state image sensors and reconstructing the color images.

2. Background Information

Photographic equipment such as digital cameras and digital camcorders may contain electronic image sensors that capture light for processing into still or video images. Electronic image sensors typically contain millions of light capturing elements such as photodiodes. The elements each receives light that passes through a color filter in a two-dimensional color filter array.

FIGS. 1A and 1B are illustrations showing prior-art color filter arrays according to the Bayer pattern in primary colors.

FIGS. 2A and 2B are illustrations showing prior-art color filter arrays employing only green and magenta colors.

BRIEF SUMMARY OF THE INVENTION

According to a first aspect, the present invention relates to an image sensor supported by a substrate of a first conductivity type, comprising a two-dimensional array of a two-by-two array of adjacent pixels where the two-by-two array comprises a pair of green pixels along a diagonal and a pair of a red pixel and a magenta pixel along the other diagonal, where each of the green pixels has a green color filter and a photodetector that receives light from the green color filter, where the red pixel has a red color filter and a photodetector that receives light from the red color filter, and where the magenta pixel comprises (a) a magenta color filter, (b) a group of vertically stacked second regions of a second conductivity type, said group comprising (i) a shallow second region, (ii) a deep second region, and (iii) a mezzanine second region situated between the shallow second region and the deep second region; (c) a first transfer switch, said first transfer switch being coupled to transfer charges from said shallow second region; and (d) a second transfer switch, said second transfer switch being coupled to transfer charges from said deep second region.

In the first aspect, the first conductivity type may be p-type and the second conductivity type may be n-type.

In the first aspect, it is further desirable that the magenta color filter has a minimum in its transmittance at between 520 nm and 570 nm of wavelength of light in air.

In the first aspect, it is further desirable that the magenta color filter has a maximum in its transmittance at between 420 nm and 480 nm of wavelength of light in air. It is still further desirable that the magenta color filter has transmittance in excess of 50% at 650 nm of wavelength of light in air. Alternatively, it is still further desirable that the magenta color filter has transmittance at 650 nm of wavelength of light in air that is at least four times its transmittance at 550 nm of wavelength of light.

In the first aspect, it is further desirable that said red pixel has one photodetector. It is still further desirable that said one photodetector comprises one or more electrically connected second regions that extend to a depth of at least 1.5 μm. Alternatively, it is still further desirable that said one photodetector comprises a second region that is not stacked with another second region not electrically connected and is fully depleted of carriers of a type during a reset.

In the first aspect, it is further desirable that said magenta pixel further comprises a shallow first region between said shallow second region and said mezzanine second region. It is also further desirable that said pixel array further comprises a deep first region between said deep second region and said mezzanine second region. It is still further desirable that the shallow (or deep) first region maintain a continuous neutral region horizontally across itself during a charge integration period of either or both the deep or shallow second regions. It is even further desirable that the neutral region is wedged between a first depletion region that extends from the mezzanine second region and a second depletion region that extends from either of the deep or shallow second region on the other side of the neutral region.

In the first aspect, it is further desirable that said mezzanine second region maintains a neutral region that is wedged between a first depletion region that grows from the shallow second region and a second depletion region that grows from the deep second region, whereby a capacitive coupling between the shallow and deep second regions is attenuated. It is still further desirable that the neutral region is held at a predetermined voltage level when a charge integration period begins in the shallow second region or the deep second region and is held at a predetermined voltage level when the charge integration period ends. Alternatively, it is still further desirable that the neutral region is held at a first voltage level when a charge integration period begins in the shallow second region or the deep second region and is held at the first voltage level when the charge integration period ends.

According to a second aspect, the present invention relates to a method for forming a color image from a mosaic image that comprises a two-dimensional array of two-by-two arrays of image pixels where each two-by-two array comprises a pair of green image pixels along a diagonal and a pair of a red image pixel and a magenta image pixel along the other diagonal, the red image pixel comprises a first signal that has a essentially red spectral response, the magenta image pixel comprises a second signal that has an essentially red spectral response, comprising forming a third signal to represent red color for the magenta image pixel as a function of at least the first and second signals. It is desirable that a magnitude of a derivative of the third signal with respect to the second signal has a minimum. It is further desirable that a location of the minimum within a range of the second signal varies with the first signal. It is even further desirable that the magnitude varies by at least two times between the minimum and where the magnitude is largest. Alternatively, it is further desirable that a derivative of the third signal with respect to the first signal is larger where the second signal attains the minimum than where the second signal is in a different state. Alternatively, it is further desirable that the magnitude attains a smaller minimum value where another red pixel signal from another red image pixel adjacent to the magenta image pixel is identical to the first signal than if it differs from the first signal by a quarter of a range of red pixel signal values of the mosaic image.

In the second aspect, the magenta image pixel may further comprise a fourth signal that has a magenta spectral response. The method may further comprise forming a fifth signal to represent blue color for the magenta image pixel by subtracting a first multiple of the second signal from a second multiple of the fourth signal. Alternatively, the method may further comprise forming a fifth signal to represent blue color for the magenta image pixel by subtracting a first multiple of the third signal from a second multiple of the fourth signal.

According to a third aspect, the present invention relates to a demosaicking unit (or means) that receives a mosaic image as described above in connection with the second aspect and outputs a third signal for the magenta image pixel such that the third signal has essentially a red spectral response and has a better SNR than the second signal and that it is a function of at least the first and second signals. It is desirable that a magnitude of a derivative of the third signal with respect to the second signal has a minimum. It is further desirable that a location of the minimum within a range of the second signal varies with the first signal. It is even further desirable that the magnitude varies by at least two times between the minimum and where the magnitude is largest. Alternatively, it is even further desirable that a derivative of the third signal with respect to the first signal is larger where the second signal attains the minimum than where the second signal is in a different state.

According to a fourth aspect, the present invention relates to a nonvolatile computer data storage medium carrying computer-executable instructions, which when executed by a demosaicking unit causes the demosaicking unit to implement one or more above aspects of the method.

BRIEF DESCRIPTION OF THE DRAWINGS

FIG. 8 shows a vertical section of an embodiment of a magenta pixel that includes stacked photodiodes;

FIG. 9 is a graph that shows a vertical profile of net doping concentration along the YY' vertical single-dot-dash line through the stacked photodiodes of the magenta pixel shown in FIG. 8;

FIG. 10A, 10B, 10C show three alternate configurations for driving terminal $V_{sink}$ that connects to a mezzanine photodiode within the stack of photodiodes;

FIG. 11 is a graph that shows probability of photon penetration in silicon as a function of penetration depth;

FIG. 16 is a graph that shows spectral responses of the deep and shallow photodiodes in conjunction with the second magenta filter, and a composite response that is a weighted difference between them;

FIG. 17 shows a vertical section of a second embodiment of the magenta pixel;

FIG. 18 shows a vertical profile of net doping concentration along the YY' vertical single-dot-dash line in FIG. 17 of the second embodiment of the magenta pixel;

FIG. 19 shows a depletion region from the shallow second region and a depletion region from the deep second region sandwiching a neutral region that extends horizontally across the mezzanine second region;

FIG. 20 shows a vertical section of a third embodiment of the magenta pixel;

FIG. 21 shows a vertical profile of net doping concentration along the YY' vertical single-dot-dash line in FIG. 20 of the third embodiment of the magenta pixel;

DETAILED DESCRIPTION

Disclosed is an image sensor that includes a red-green-magenta color filter array over a pixel array supported by a substrate.

Figure 1A:
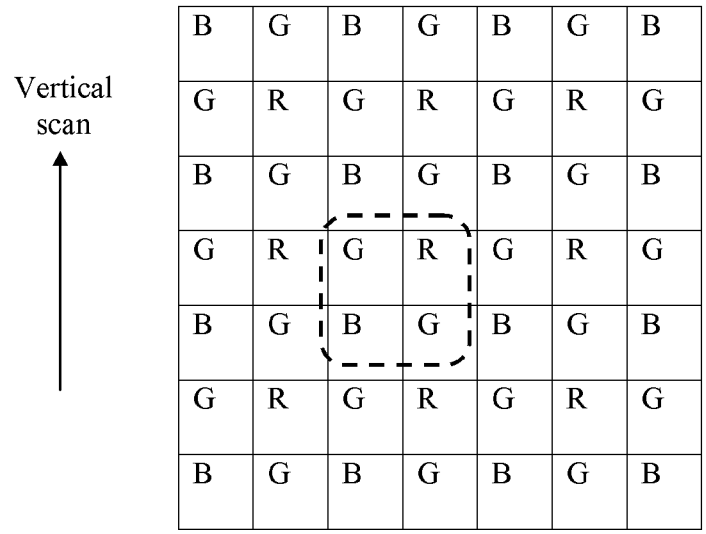
FIGS. 1A and 1B are illustrations showing prior-art color filter arrays according to the Bayer pattern in primary colors.
Figure 1B:
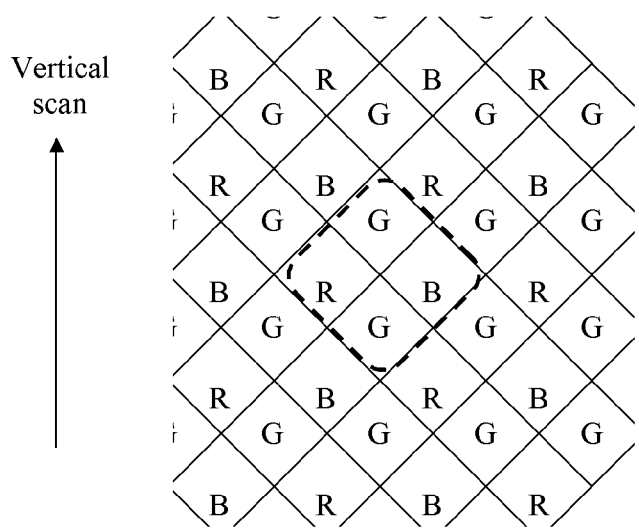
Figures 2A, 2B:
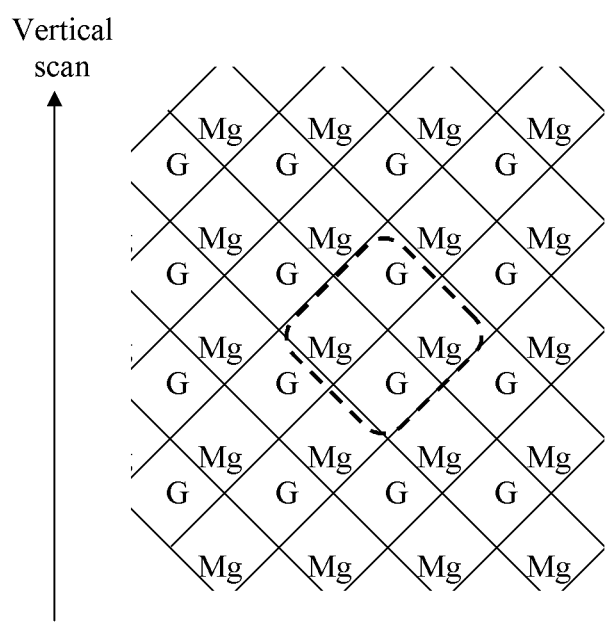
FIGS. 2A and 2B are illustrations showing prior-art color filter arrays employing only Green and Magenta colors.
Figure 3:
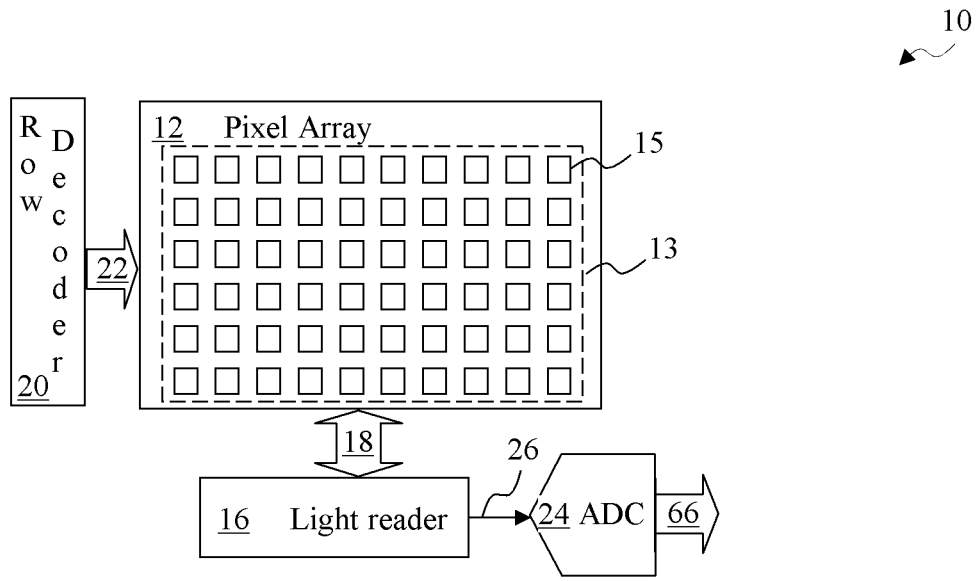
FIG. 3 shows an embodiment of an image sensor.
Figure 4:
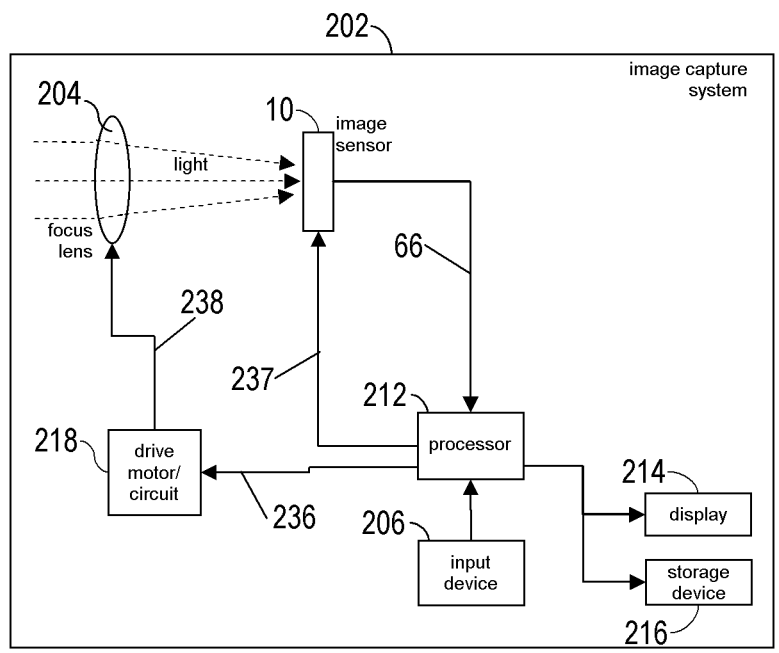
FIG. 4 shows an embodiment of an image capture system.

FIG. 3 and FIG. 4 describe an image sensor 10 according to the present invention and an image capture system 202 according to the present invention, respectively.

Referring to the drawings more particularly by reference numbers, FIG. 3 shows an embodiment of an image sensor 10 that comprises a pixel array 12, a row decoder 20, a light reader 16, and an ADC 24. The pixel array comprises a two dimensional array of a two-by-two group 15 of pixels, where each pixel has one or more photodetector(s) and a color filter that filters light before it reaches the photodetector(s). Bus 18 comprises column output signals lines the connect pixels by the column. The light reader 16 is as described in U.S. Pat. No. 7,233,350 or as described in U.S. patent application Ser. No. 12/639,941. It has one or more capacitor(s) for sampling each column output signal in the bus 18. Analog output signal (s) 26 from the light reader 16 is provided to ADC 24 for conversion into digital image data that are output onto bus 66. Row decoder 20 provides row signals in bus 22 for selecting pixels by the row, for resetting pixels by the row, and for transferring charges in pixels by the row. Color filter array 13 is a two-dimensional array of color filters that overlay photodetectors of the pixel array 12.

FIG. 4 shows an embodiment of an image capture system 202 that includes the image sensor 10, a focus lens 204, a drive motor and circuit 218, a processor 212, an input device 206, a display 214, and a storage device 216.

Pixel Array

FIGS. 5A-7C describe the pixel array 12.

Figure 5A:
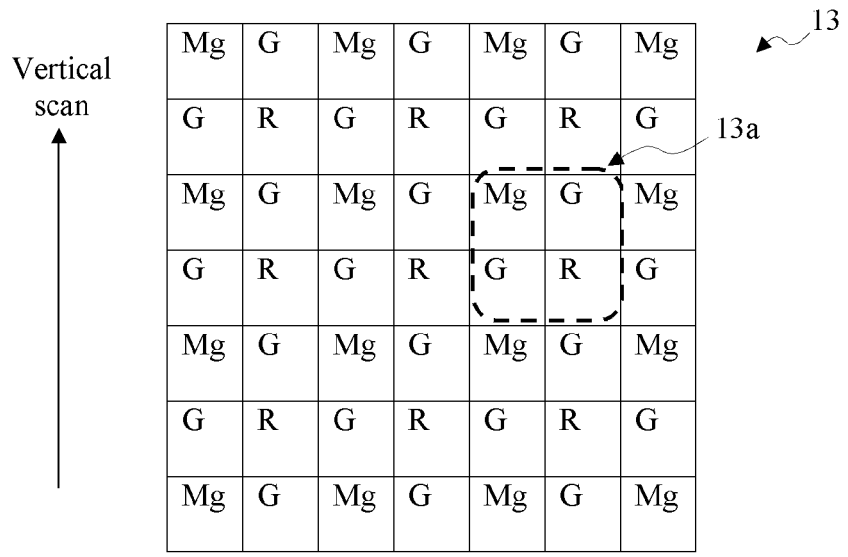
FIGS. 5A and 5B are illustrations showing color filter arrays.
Figure 5B:
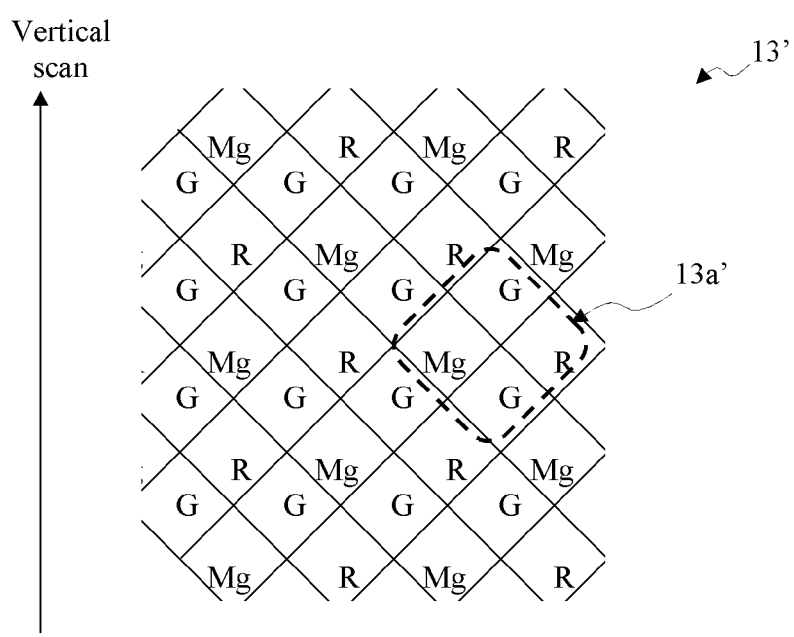

FIGS. 5A and 5B are illustrations showing color filter arrays according to the present invention;

FIG. 5A shows a color filter array 13 according to the present invention. Image output from the pixel array 12 begins at the bottom and progresses to the top, in the direction indicated by the "Vertical Scan" arrow. The color filter array 13 is organized as a two-dimensional array of color filters of Green (G), Red (R), and Magenta (M) colors. More particularly, the color filter array 13 is organized as a two-dimensional array of a two-by-two unit 13a that consists of a pair of Green (G) color filters disposed along one diagonal and a pair of a Red (R) color filter and a Magenta (M) color filter disposed along the other diagonal.

FIG. 5B shows color filter array 13' as an alternate embodiment of color filter array according to the present invention. This color filter array 13' is rotated 45 degrees with respect to the direction of vertical scan. More particularly, the color filter array 13' is organized as a two-dimensional array of a two-by-two unit 13a' that is 45-degree rotated with respect to the vertical scan direction.

Figure 6:
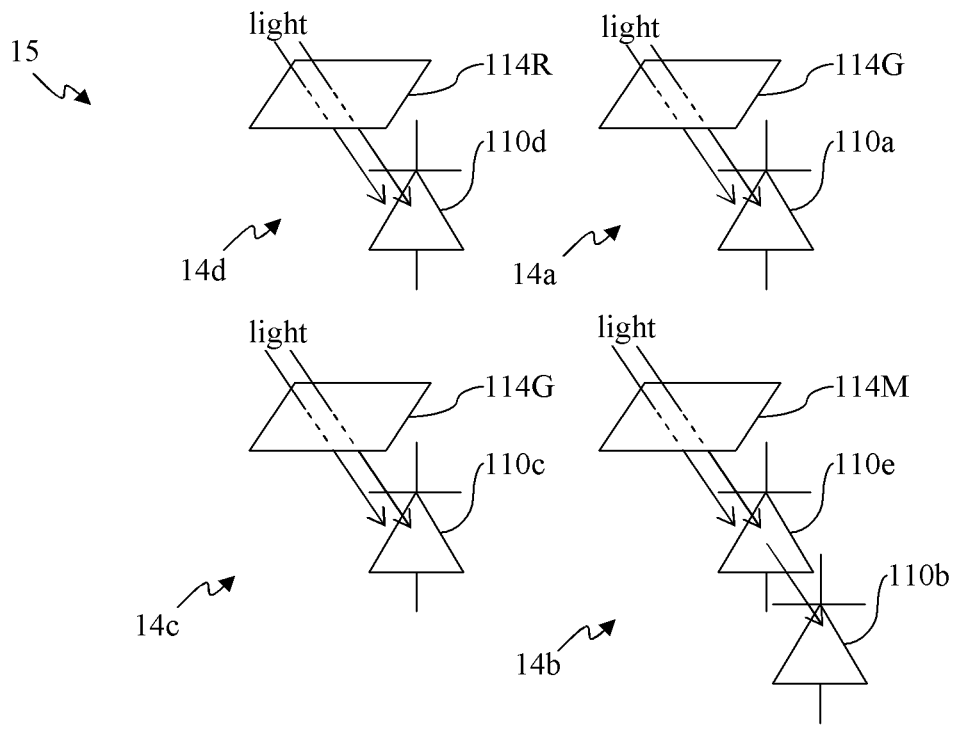
FIG. 6 shows a schematic of a color filter and corresponding photodetector(s) for each of the four pixels of a two-by-two group of adjacent pixels in an embodiment of a pixel array.

FIG. 6 is a schematic of four pixels in the two-by-two pixel group 15, showing a color filter and corresponding photodetector(s) for each of the four pixels. A pair of green color filters 114G, a red color filter 114R and a magenta color filter 114M are arranged in the order according to the two-by-two unit 13a shown in FIG. 5A. On the upper-right, green pixel 14a has a green color filter 114G that filters light for photodiode 100a. On the lower-right, magenta pixel 14b has a magenta color filter 114M that filters light for photodiode 114e and photodiode 100b. On the lower-left, green pixel 14c has a green color filter 114G that filters light for photodiode 100c. On the upper-left, red pixel 14d has a red color filter 114R that filters light for photodiode 100d.

Figure 7A:
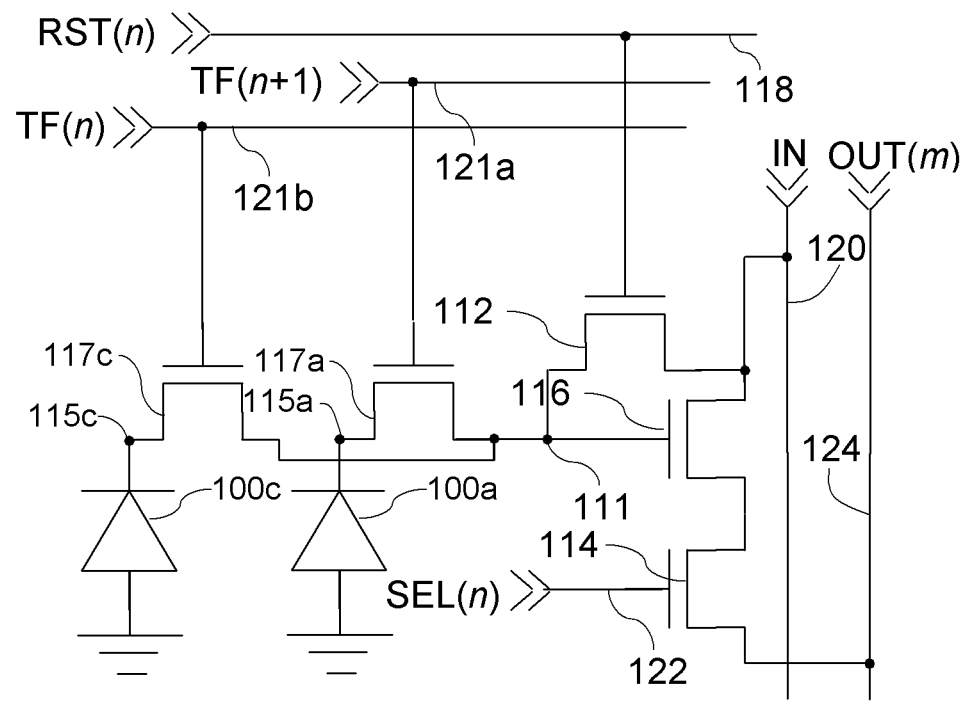
FIGS. 7A, 7B and 7C are schematics of the photodetectors and related circuitries within the pixel array.
Figure 7B:
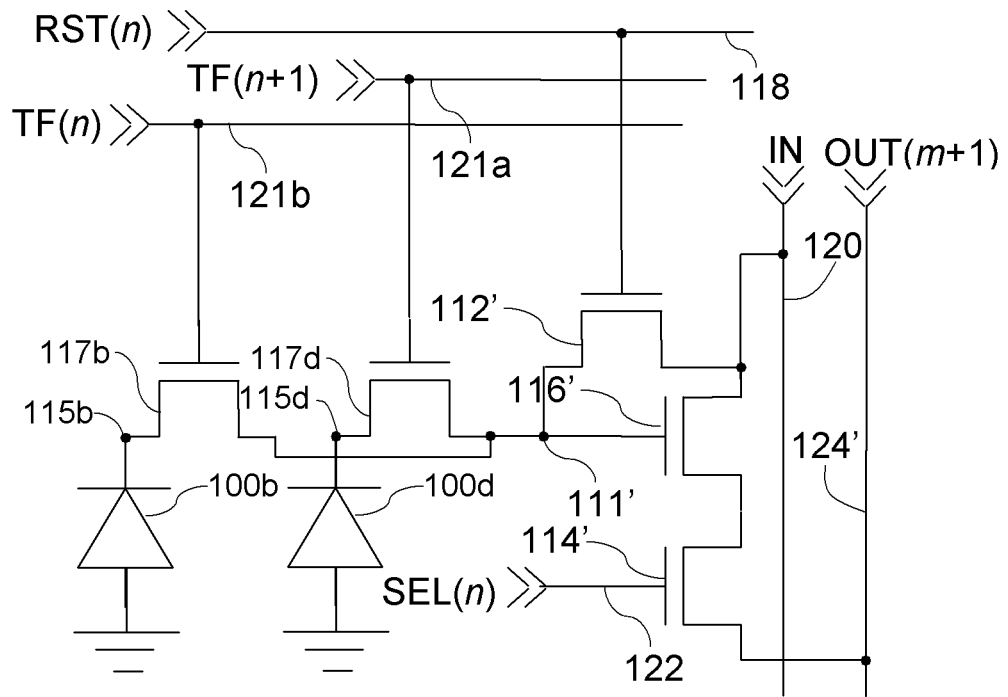
Figure 7C:
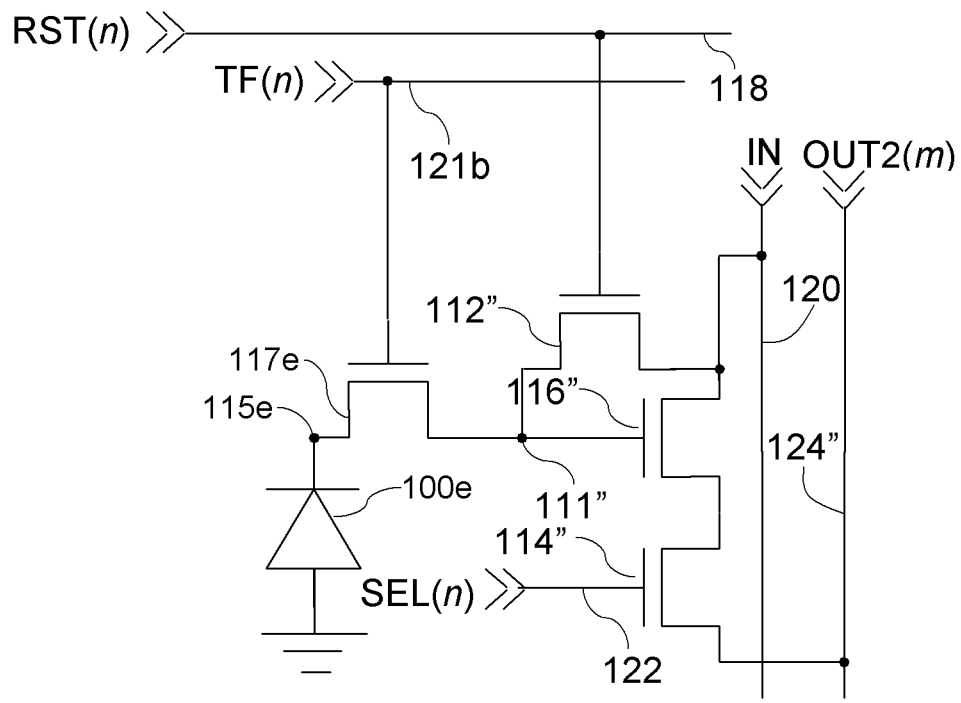

FIGS. 7A, 7B and 7C are schematics of the photodetectors 100a-100e and exemplary circuitries within the pixel group 15.

FIG. 7A shows the photodetectors 100a, 100c of the two green pixels 14a, 14c, respectively, connected to sensing node 111 by transfer switches 117a, 117c, respectively. A high pulse on row signals TF(n+1) 121a (or TF(n) 121b) from bus 22 turns on transfer switch 117a (or 117c) to transfer charges from the photodiode 100a (or 100c) to the sensing node 111. Output transistor 116 buffers a sensing node voltage signal on the sensing node 111 onto column output signal line OUT(m) 124 via select switch 114, which is turned on by row signal SEL(n) 122, output in bus 22 by row decoder 20.

In one mode, the transfer switches 117a, 117c may be turned on separately without overlapping the charge-transfer pulses on the respective TF(n) and TF(n+1) signals. In another mode, the transfer switches 117a, 117c may be in a conductive state simultaneously, resulting in summing of charges from photodiodes 110a, 100c.

Output signal on column output signal line OUT(m) 124 is part of bus 18 and may be sampled by the light reader 16. U.S. patent application Ser. No. 12/639,941 shows various method of the sequence of operating switches in such a circuit and sampling the column output signal, said various methods being incorporated herein by reference. Alternatively, the switches may be operated and the column output signal sampled according to conventional correlated double sampling for pinned photodiode.

The photodiodes 100a (or 100c), transfer switches 117a (or 117c), reset switch 112 and select switch 114 may be operated in accordance with any method shown in U.S. patent application Ser. No. 12/639,941. In particular, to begin integrating charge on the photodetector 100a (or 100c), an output signal transmitted by the output transistor 116 onto column signal line OUT(m) 124 is sampled by a light reader when the reset switch 112 and the transfer switch 117a (or 117c) are both in triode region; an output signal is subsequently sampled again when the reset switch 112 is turned off while the transfer switch 117a (or 117c) remains in triode region; an output signal is finally sampled again after the transfer switch 117a (or 117c) switches off; and, a signed-weighted sum among these three sample signals is formed to provide a noise signal. To end charge integration, an output signal from output transistor 116 is sampled on column signal line OUT(m) 124 when the reset switch 112 is in triode region while the transfer switch is non-conducting; the reset switch 112 is subsequently switched off and an output signal on column signal line OUT(m) 124 sampled; an output signal on line OUT(m) 124 is sampled again when the transfer switch 117a (or 117c) is switched to triode region; and, a signed-weighted sum among these three sampled signals is formed to provide a light response signal. The noise signal is subtracted from the light response signal to provide a de-noised light response output signal. This subtraction may be performed on the image sensor 10 or on processor 212.

Alternatively, the photodiodes 100a (or 100c), transfer switches 117a (or 117c), reset switch 112 and select switch 114 may be operate in accordance with correlated double sampling method for a pinned photodiode pixel. To begin a charge integration: (i) turn on the transfer switch 117a (or 117c) and the reset switch 112 and completely deplete photodiode 100a (or 100c), (ii) switch off the transfer switch 117a (or 117c) and the reset switch 112. To end a charge integration: (A) row signal RST(n) 118 has a positive pulse that turns the reset switch 112 on and off, thus resetting the sensing node 111, (B) row signal SEL(n) 122 selects select switch 114 to transmit a buffered and level-shifted reset output signal from the output transistor 116 to the light reader 16, (C) the light reader samples the output signal, (D) the transfer switch 117a (or 117c) is turned on and charges from the photodiode 100a (or 100c) are transferred to the sensing node 111, (E) the light reader samples an output signal from the output transistor 116, and (F) a difference is taken between the two sampled output signals.

FIG. 7B shows a schematic of a circuit supporting the photodetector 100b of the magenta pixel 14b and the photodetector 100d of the red pixel 14d, respectively. FIG. 7C shows a schematic of a circuit supporting the photodetector 100e of the magenta pixel 14b. As in FIG. 7A, each of the photodetectors 100b, 100d and 100e may have its initial resetting and final sensing operated according to either a method of U.S. patent application Ser. No. 12/639,941 or the correlated double sampling method.

The arrangement and mutual connections between the photodiodes and row control signals RST(n), TF(n) and TF(n−1), and between the photodiodes and column output signals OUT(m), OUT(m+1) and OUT2(m) may be rearranged in different ways as one skilled in the art would be able to, such as for adapting to a 45-degree rotated color filter array described in FIG. 5B.

Furthermore, any one of the photodetectors may have its associated circuitries operated according to a method of U.S. patent application Ser. No. 12/639,941 as described above whereas another photodetector according to the method of correlated double sampling. For example, the photodetector 110e may have its associated reset switch 112″ and transfer switch 117e operated according to the correlated sampling method whereas the photodetector 100b from the same magenta pixel 114b may have its transfer switch 117d operated according to a method of U.S. patent application Ser. No. 12/639,941. It is noted that, in this case, the transfer switch 117d for the photodiode 100b is in a triode region when a light response output signal from the photodiode 100b is sampled by the light reader 16, whereas the transfer switch 117e for the photodiode 115e is in a non-conductive state after charges integrated on the photodiode 100e are already transferred to the sensing node 111″ and a corresponding output signal on the OUT2(m) line is sampled onto a sampling capacitor. Furthermore, any such photodetector that operates according to the correlated double sampling method may be provided with a separate set of row control signals RST2(n) and/or TF2(n) in the bus 22 that pulses in accordance with the correlated double sampling control sequences (i)-(ii) and (A)-(E) above.

Magenta Pixel

FIGS. 8-23 describe the magenta pixel 14b.

First Embodiment of Magenta Pixel

FIG. 8 shows a vertical section of a first embodiment of a magenta pixel 14b that includes stacked photodiodes 100e, 100f, 100b according to the present invention. Formed in a lightly doped semiconductor substrate 56 of a first conductivity type, preferably p-type, and further preferably having a doping concentration between $5e14/cm^3$ and $5e15/cm^3$, are deep 100b and shallow 100e photodiodes. The substrate 56 may be a lightly doped p-epi layer on top of a heavily doped p-substrate having doping concentration in excess of $1e19/cm^3$. Photodiode 100b is deepest into the substrate 56 and comprises deep second region 54c of a second conductivity type, preferably n-type. The shallow photodiode 100e is shallow in the substrate 56 and comprises shallow second region 54a of the second conductivity type that is stacked above the deep second region 54c and is under a surface first region 63 that prevents depletion region that grows from the shallow second region 54a from reaching the top interface of the substrate 56. Separating the photodiodes 100b, 100e is a shallow first region 65a and a deep first region 65b below the shallow first region 65a, both belonging to the first conductivity type. Furthermore, the shallow and deep first regions 65a, 65b sandwich between them a mezzanine photodiode 100f that comprises a mezzanine second region 54b of the second conductivity type. Together, the shallow 100e, mezzanine 100f and deep 100b photodiodes constitute stacked photodiodes for the magenta pixel 14b.

The shallow second region 54a preferably reaches a depth of between 0.4 um to 1.2 um. The deep second region 54c preferably begins from a depth of between 1.7 um and 2.5 um. The mezzanine second region 54b preferably occupies a range of depth deeper than 1 um and shallower than 2 um, more preferably between 1.2 um and 1.8 um.

In this embodiment, incident light from above the magenta pixel 14b first is filtered by the magenta color filter 114M then is transmitted to the stacked photodiodes via a pair of cascaded light guides 130, 116.

Barrier regions 64 of the first conductivity type is disposed in the substrate 56 beside the deep second region 54c, separating the deep second region 54c from depletion region that grows from any of the adjacent green 114a, 114c or red 114d pixels. The barrier region 64 has a net doping concentration higher than the background doping concentration of the substrate 56, preferably peaking between $1e16/cm^3$ and $7e17/cm^3$. The barrier region 64 maintains a neutral region within itself that separates depletion region that grows from the deep second region 54c from depletion region that grows from any of the adjacent green and red pixels to reduce inter-pixel crosstalk that happen via capacitive coupling across the substrate 56.

The deep second region 54c is electrically connected to transfer switch 117b by second regions 57b, 55b that belong to the second conductivity type. The transfer switch 117b comprises gate 58b and a drain diffusion (of the second conductivity type, at the top interface of the substrate 56) that is also the sensing node 111. The sensing node 111 is further connected to output transistor 116 and reset switch 112 (shown only in symbols).

The shallow second region 54a is electrically connected to transfer switch 117e by a second region 55e of the second conductivity type. The transfer switch 117e comprises gate 58e and a drain diffusion (of the second conductivity type) which is also the sensing node 111″. The sensing node 111″ is further connected to output transistor 116″ and reset switch 112″ (shown only in symbols).

The mezzanine second region 54b is electrically connected by a chain of second regions 57f to a diffusion node $V_{sink}$ in FIG. 8, but the diffusion may be replaced by an arrangement similar to the second region 55e and the surface first region 66a and a switch similar to the transfer switch 117e, as schematically shown in FIG. 10C, described below.

Additional first regions 66a, 66b prevent depletion regions that grow from different photodiodes 100b, 100e, 100f from merging.

FIG. 9 is a graph that shows a vertical profile of net doping concentration through the stacked photodiodes of the magenta pixel shown in FIG. 8. "A" labels net doping concentration of the shallow second region 54A. "B" is of the shallow first region 65a. "C" is of the mezzanine second region 54b. "D" is of the deep first region 65b. "E" is of the deep second region 54c. Beyond "E" is that of the substrate 56.

FIG. 10A, 10B, 10C show three alternative configurations for driving terminal $V_{sink}$ that connects to the mezzanine photodiode 100f within the stack of photodiodes. FIG. 10A shows the $V_{sink}$ terminal being connected to ground. FIG. 10B shows the $V_{sink}$ terminal being driven by a buffer that switches between a ground and a voltage source, where the voltage source may provide a adjustable voltage level. FIG. 10C shows the $V_{sink}$ terminal being driven by a buffer through a switch and the buffer buffers an adjustable voltage source.

The $V_{sink}$ terminal may be held at a predetermined voltage level when a charge integration period begins in the shallow photodiode 100e or the deep photodiode 100b and is held at a predetermined voltage level when the charge integration period ends. More preferably, the $V_{sink}$ terminal may be held at a first voltage level when a charge integration period begins in the shallow second region 100e or the deep second region 100b and is held at the first voltage level when the charge integration period ends. Even more preferably, the $V_{sink}$ terminal may be held at a constant voltage throughout the charge integration period. A neutral region continues from the mezzanine second region 54b to the $V_{sink}$ terminal. This neutral region has the voltage of the $V_{sink}$ terminal, and acts to sweep away electrons within the mezzanine second region 54b. Photons of wavelengths about 500+/−20 nm that do not get absorbed in the shallow second region 54a but gets absorbed in the mezzanine second region 54b generate free electrons in the mezzanine second region 54b. These free electrons are swept away from the substrate, preventing them from being captured by the deep photodiode 100b, which would otherwise cause the deep photodiode to have a spectral response in the 500+/−20 nm range of wavelength.

Likewise, the mezzanine second region may be electrically maintained at a potential at a time when a transfer switch 117e (or 117b) is in a conductive state to transfer charges from one or the other of the shallow second region 54a and the deep second region 54c to a sensing node 111" (or 111) that is in a floating state.

FIG. 11 is a graph that shows probabilities of photon penetration in silicon as a function of penetration depth. In particular, it shows that: (A) about 90% of 450 nm-wavelength (blue) photons are absorbed within the first 1 μm in silicon; (B) 40% of 650 nm-wavelength (red) photons survive beyond 2 μm and 50% survive beyond 3 μm; and (C) between 1 μm & 2 μm the silicon absorbs 20% of 650 nm-wavelength photons, 30% of 550 nm-wavelength (green) photons and 10% of 450 nm-wavelength (blue) photons.

Figure 12:
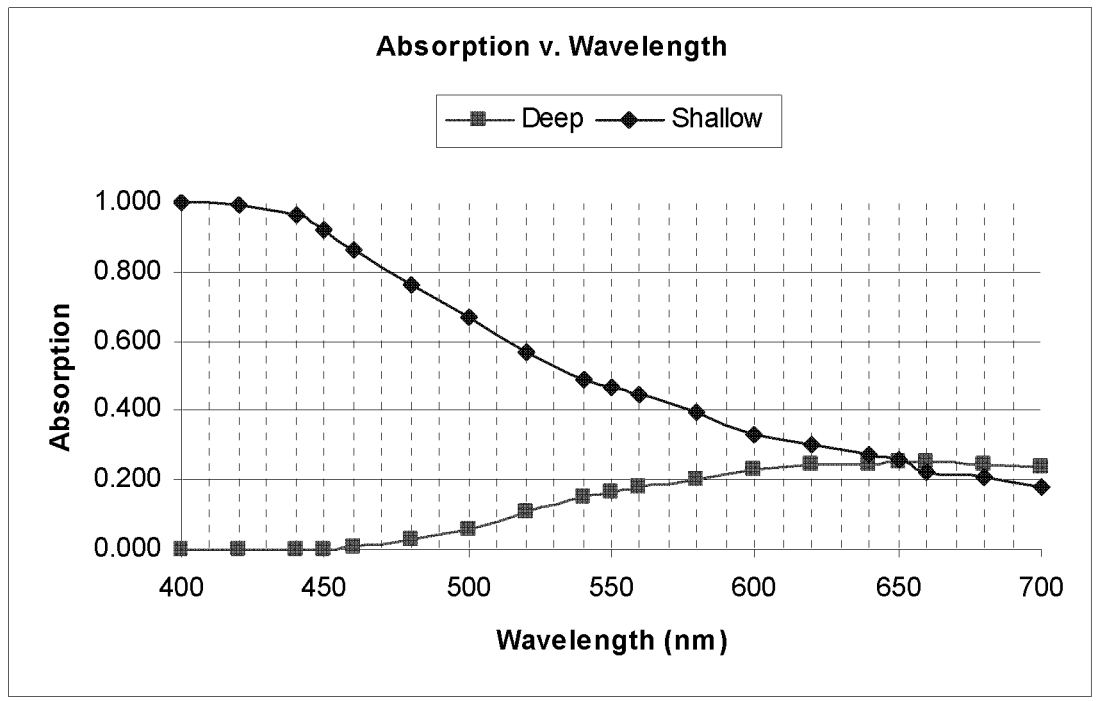
FIG. 12 is a graph that shows absorption efficiency of photon by a deep photodiode and separately by a shallow photodiode as a function of wavelength of light in air.

FIG. 12 is a graph that shows absorption efficiency of photon by the deep photodiode 100b and separately by the shallow photodiode 100e as functions of wavelength of light in air. The absorption efficiency is a probability that a carrier generated by a photon of a particular wavelength (in air) will be captured by the photodiode. Carriers captured by the mezzanine photodiode 100f is removed via the $V_{sink}$ terminal. As shown in FIG. 12, the absorption efficiency for the shallow photodiode 100e is highest in the purple region (wavelength<450 nm) and steadily declines, as wavelength increases beyond 450 nm, to approximately 0.2 in the red range (wavelength>600 nm). For the deep photodiode 100b, on the other hand, absorption efficiency is highest in the red range, at around 0.25, and falls steadily, as wavelength decreases to 500 nm, to below 0.05.

The magenta color filter 114M should have low transmittance for green light between wavelengths of 500 nm and 600 nm, reaching a minimum of 10% or less. It should have high transmittance for blue light of wavelengths between 400 nm and 500 nm, peaking at 450 nm+/−20 nm, attaining a peak transmittance of at least four times the minimum at green. It should also have high transmittance for red light of wavelengths larger than 600 nm, reaching within 10% of maximum transmittance at 650 nm+/−30 nm.

Figure 13:
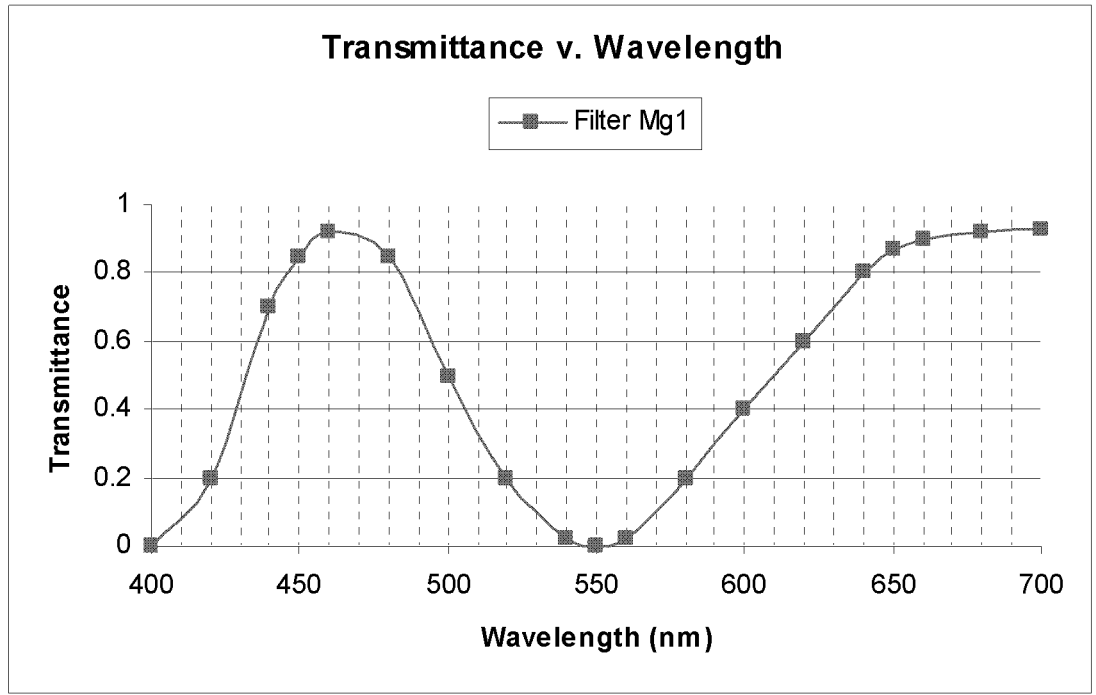
FIG. 13 is a graph that shows light transmittance of a first magenta color filter as a function of wavelength of light in air.

FIG. 13 is a graph that shows transmittance of light of a first magenta color filter as a function of wavelength of light in air. The transmittance has two peak regions, one centering around wavelength of 450 nm ("blue peak"), another around 650 nm ("red shoulder"), and has a valley between 500 nm and 600 nm of wavelength as well as a decline to less than 10% of the blue peak's maximal transmittance for wavelengths below 410 nm.

It should be noted that, if a magenta color filter and/or a red color filter employed on the pixel array 12 has a shoulder in transmittance in the red range (600 nm to 700 nm) such as shown in FIG. 13 instead of a fall beyond 650+/−20 nm, an infrared filter may be deployed in the path of light before the pixel array 12 such that the composite transmittance of the magenta/red color filter and the infrared filter declines beyond 650+/−20 nm to substantially less than the peak transmittance of the red range, preferably less than 10% by 700 nm of wavelength.

Figure 14:
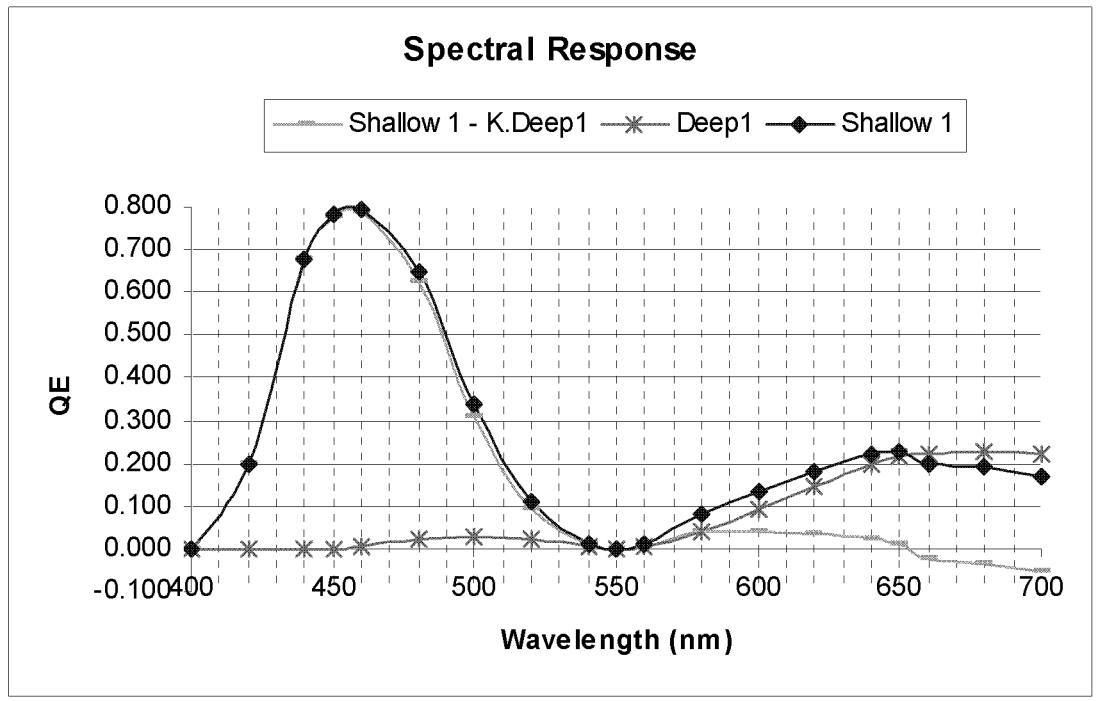
FIG. 14 is a graph that shows spectral responses of the deep and shallow photodiodes in conjunction with the first magenta filter, and a composite response that is a weighted difference between them.

FIG. 14 shows a graph of spectral responses of the deep 100b and shallow 100e photodiodes in conjunction with the first magenta filter, and a weighted difference between them. The spectral response from the shallow photodiode 100e, labeled Shallow1, has a bell shape in the blue range (400 nm to 500 nm) with a peak centered between 430 nm and 470 nm, and has a minimum at around 550 nm. Shallow1 has a shoulder in the red range whose height is approximately one fourth that of the peak in the blue range.

The spectral response from the deep photodiode 100b, labeled Deep1, on the other hand, has a shoulder in the red range similar to Shallow1, but has negligible response in the blue range.

Both Shallow1 and Deep1 have a minimum in spectral response at around 550 nm+/−20 nm due to the minimum in the transmittance the first magenta color filter in this range of wavelength.

FIG. 14 also shows a composite spectral response that is a weighted difference between Shallow1 and Deep1, Shallow1−K·Deep1, where the weight K is 1 in this example but may be above 1 or below 1 in practice. The composite spectral response follows the Shallow1 response in the blue range, but in the red range is much attenuated, resulting in a composite spectral response that essentially is responsive only to blue light, i.e. a blue spectral response.

It should be noted that, as aforementioned, when an infrared filter is disposed in the path of light before pixel array 12, the combined transmittance of the first magenta color filter and the infrared filter has a decline between 650 nm+/−20 nm and 700 nm. Therefore, taking into account the infrared filter, the Shallow1 spectral response will exhibit a peak centered at 650+/−20 nm, which is essentially a red spectral response, although a much attenuated one, having peak response of only 0.2.

Figure 15:
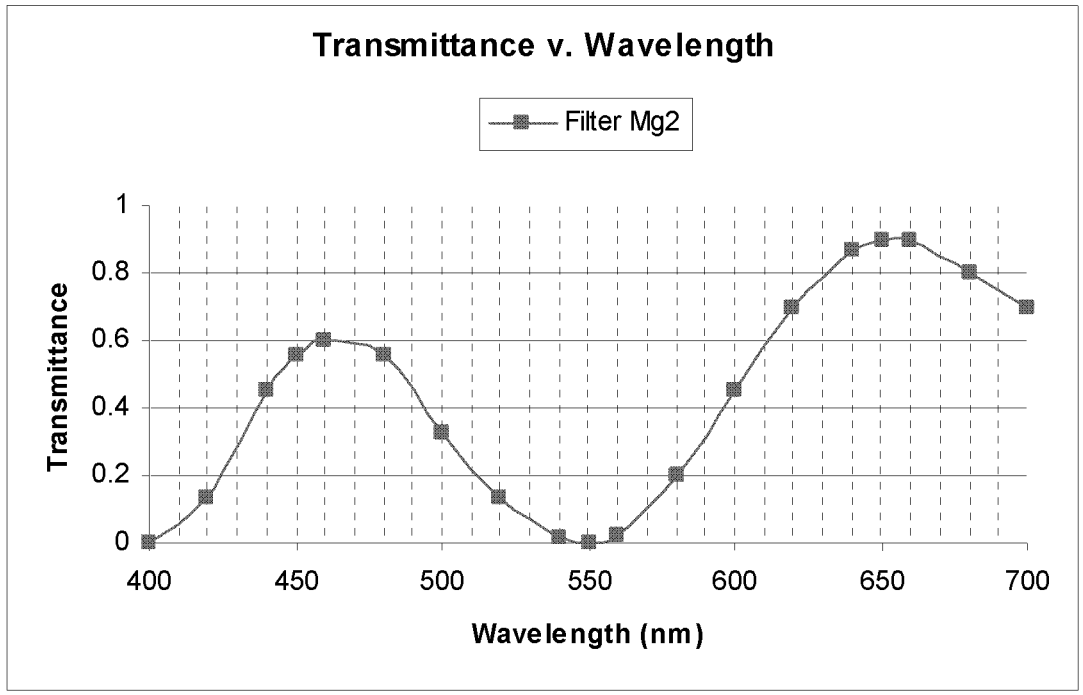
FIG. 15 is a graph that shows light transmittance of a second magenta color filter as a function of wavelength of light in air.

FIG. 15 is a graph that shows transmittance of light of a second magenta color filter as a function of wavelength of light in air. Similar to FIG. 13 for the first magenta color filter, the transmittance of the second magenta color filter has two peak ranges, one centering around wavelength of 450 nm ("blue peak", another around 650 nm ("red peak"), and has a valley between 500 nm and 600 nm of wavelength as well as a decline to less than 10% of the blue peak's maximal transmittance for wavelengths below 410 nm.

FIG. 16 is a graph that shows spectral responses of the deep 100b and shallow 100e photodiodes in conjunction with the second magenta filter, and a weighted difference between them. The spectral response from the shallow photodiode 100e, labeled Shallow2, has a bell shape in the blue range with a peak centered between 430 nm and 470 nm, and has a minimum at wavelength of around 550 nm. Shallow2, unlike Shallow1, has a peak instead of a shoulder in the red range owing to the built-in infrared cutoff in the second red color filter's transmittance. Shallow2's peak level in the blue range is approximately twice that of its peak in the red range.

The spectral response from the deep photodiode 100b, labeled Deep2, has a peak in the red range similar to Shallow2, but has negligible response in the blue range.

Both Shallow2 and Deep2 have a minimum in spectral response at around 550 nm+/−20 nm, due to the minimum in the transmittance of the second magenta color filter in this range of wavelength.

FIG. 16 also shows a composite spectral response that is a weighted difference between Shallow2 and Deep2, Shallow2−K·Deep2, where the weight K is 1 in this example but may be above 1 or below 1 in practice. The composite spectral response follows the Shallow2 spectral response in the blue range, but in the red range is much attenuated, resulting in a spectral response that essentially is responsive only to blue light, i.e. a blue spectral response.

Note that K is to be selected depending on the heights of the Shallow2 and Deep2 (or likewise Shallow1 and Deep1 above, or Shallow3 and Deep3 below) spectral responses in the red range so that the composite response has negligible response to red light compared to blue light by a ratio of 1-to-7 or less. Although in the above examples, K is 1, in practice K may be a different number either larger than 1 or less than 1. Further, although the above examples do not show a gain factor on the signals from the shallow photodiode, in practice both signals (from shallow and deep photodiodes) may each undergo a respective gain. Only for simplicity of illustration, the common gain factor is removed in the above example such that the shallow photodiode signal has a gain of 1. In other words, the K factor in the above example can be considered as a ratio of the gain factor on the deep photodiode signal to the gain factor of the shallow photodiode signal.

Second Embodiment of Magenta Pixel

FIG. 17 shows a vertical section of a second embodiment 14b' of the magenta pixel according to the present invention. The shallow 65a and deep 65b first regions of the first embodiment are absent.

FIG. 18 shows a vertical profile of doping concentration of the second embodiment 14b' of the magenta pixel;

FIG. 19 shows a depletion region (above the upper dotted line in the mezzanine second region 54b) that extends from the shallow second region 54a and a depletion region (between the lower dotted line in the mezzanine second region 54b and the upper dotted line in the deep second region 54c) that extends from the deep second region 54c sandwiching a neutral region (marked "yyyyy" and bounded by upper and lower dotted lines within the mezzanine second region 54b) that extends horizontally across the mezzanine second region 54b. The neutral region may be maintained throughout a charge integration period of either or both the shallow 100e' and deep 100b' photodiodes. The neutral region sweeps away to the $V_{sink}$ terminal any electron that enters it, either from nearby depletion region or from absorption of a photon within itself. The neutral region also attenuates capacitive coupling between the shallow 100e' and deep 100b' photodiodes by constricting connection between depletion regions that extend from their respective second regions 54a, 54c to a narrow passage (marked "xxxxx"), if any at all, between the mezzanine second region 54b and the barrier region 64 on the right of FIG. 17.

Third Embodiment of Magenta Pixel

FIG. 20 shows a vertical section of a third embodiment 14b" of the magenta pixel according to the present invention.

Magenta pixel 14b" differs from magenta pixel 14b in that the mezzanine second region 100f and the deep first region 65b are absent. Therefore a deep second region 54d of a deep photodiode 100b" may start at a shallower depth, e.g. 1.7 um, and extends downwards into the substrate 56. Although FIG. 20 shows the deep second region 54d begins where the first region 65a ends, a gap may exist between these two regions and may have the doping concentration and conductivity type of the substrate 56, since a depletion region will extend down from the shallow first region 65a, across the gap, and into the deep second region 54d. This depletion region suffices to establish an electric field to sweep electrons into the deep second region 54d.

The first region 65a has a net doping concentration higher than the substrate 56 and is sandwiched between the shallow second region 54a and the deep second region 54d. The first region 65a maintains separation of depletion regions extending from the shallow second region 54a and the deep second region 54d, respectively, at a time when a transfer switch 117e (or 117b) is in a conductive state to transfer charges from one or the other of the shallow second region 54d and the deep second region 54d to a sensing node 111" (or 111) that is in a floating state. The first region 65a also maintains separation of depletion regions extending from the shallow second region 54a and the deep second region 54d, respectively, at a time during a charge integration on either or both of the shallow second region 54a and the deep second region 54d.

FIG. 21 shows a vertical doping profile of the third embodiment of the magenta pixel 14b". "A" labels doping concentrations across the shallow second region 54a. "B" is for the shallow first region 65a. "E" is for the deep second region 54d. Beyond "E" is for the substrate 56.

Figure 22:
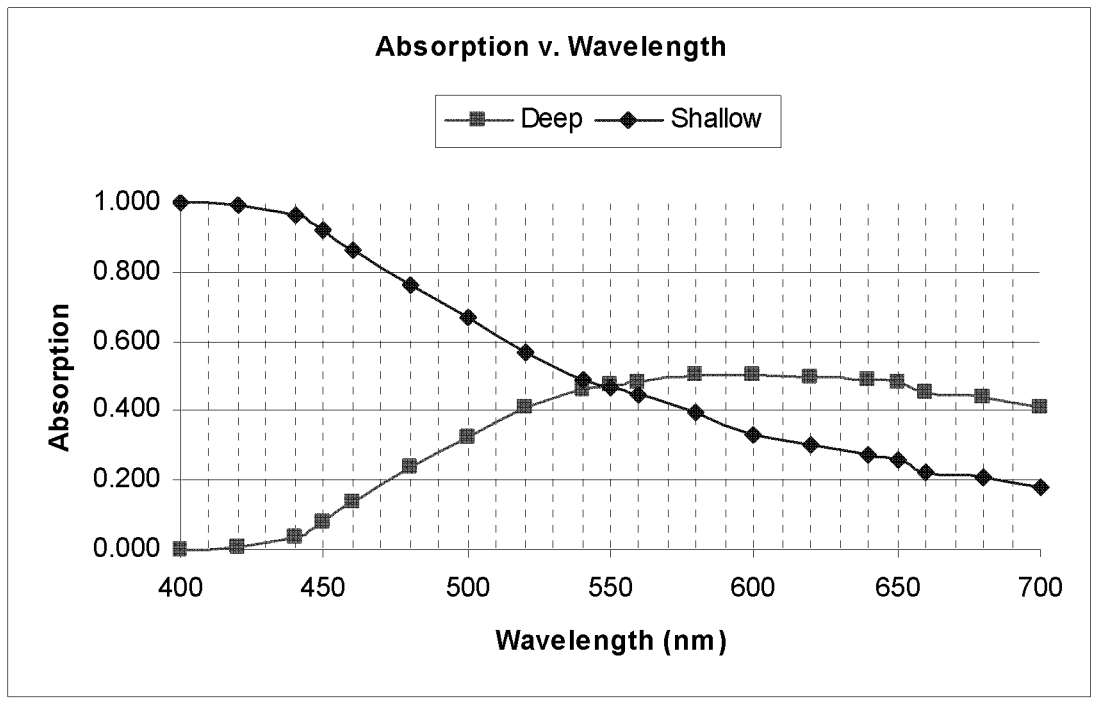
FIG. 22 is a graph that shows absorption efficiency of photon by a deep photodiode of the third embodiment and separately by a shallow photodiode of the third embodiment as a function of wavelength of light in air.

FIG. 22 is a graph that shows absorption efficiency of photon by the deep photodiode 100b" of the third embodiment and separately by the shallow photodiode 100e of the third embodiment as a function of wavelength of unfiltered light.

The absorption efficiency is a probability that a carrier generated by a photon of a particular wavelength (in air) will be captured by the photodiode. As shown in FIG. 22, the absorption efficiency for the shallow photodiode 100e is highest in the purple range (wavelength<450 nm) and beyond 450 nm it steadily declines as wavelength increases, to approximately 0.2 in the red range (wavelength>600 nm). For the deep photodiode 100b", on the other hand, its absorption efficiency is highest in the red range, at around 0.5, for wavelengths between 550 nm and 650 nm, declining steadily as wavelength decreases to 450 nm, to below 0.05.

Figure 23:
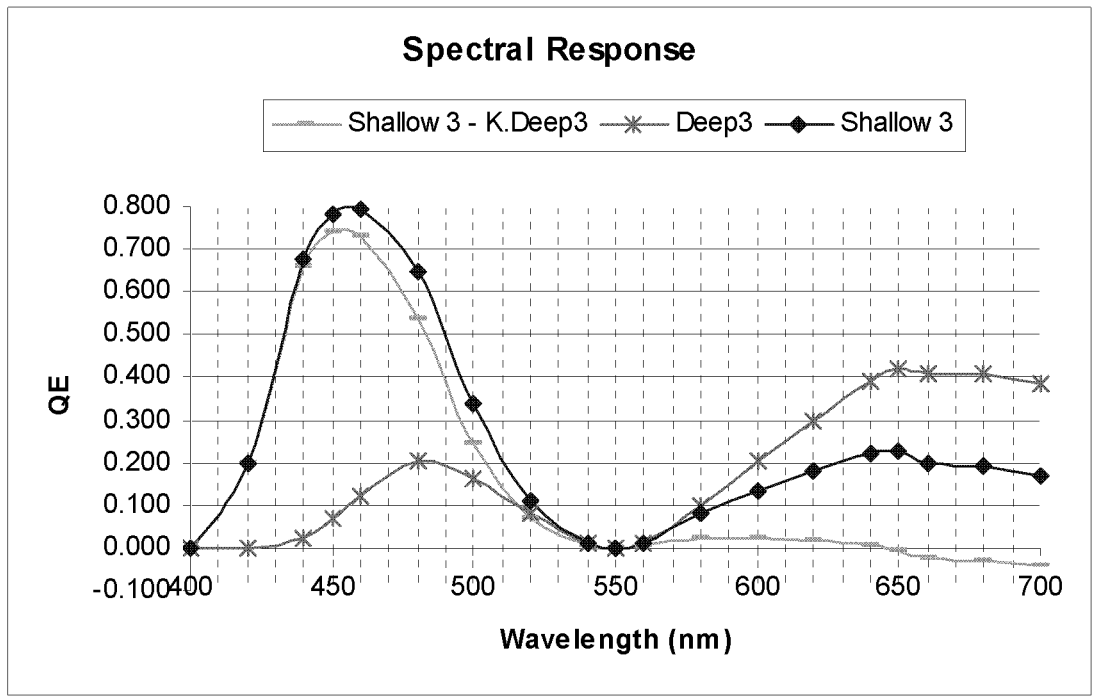
FIG. 23 is a graph that shows spectral responses of the deep and shallow photodiodes of the third embodiment in conjunction with the first magenta filter, and a composite response that is a weighted difference between them.

FIG. 23 is a graph that shows spectral responses of the deep 100b" and shallow 100e photodiodes of the third embodiment in conjunction with the first magenta filter, and a composite spectral response that is a weighted difference between them.

The spectral response from the shallow photodiode 100e, labeled Shallow3, has a bell shape in the blue range with a peak centered between 430 nm and 470 nm, and has a minimum at wavelength of around 550 nm. Shallow3, like Shallow1, has a shoulder in the red range due to a lack of built-in infrared cutoff in the transmittance of the first red color filter. Shallow3's peak level in the red range is approximately one fourth that of its peak in the blue range.

The spectral response from the deep photodiode 100b", labeled Deep3, has a shoulder in the red range similar in shape to Shallow3 but twice as high. In the blue range, the spectral response has a small peak—centered at wavelength of about 480 nm—that is half as high as the shoulder.

Both Shallow3 and Deep3 have a minimum in spectral response at around 550 nm+/−20 nm due to the minimum in the transmittance of the first magenta color filter in this range of wavelength.

FIG. 23 also shows a composite spectral response that is a weighted difference between Shallow3 and Deep3, Shallow3−K·Deep3, where the weight K is selected to be 0.5. The composite spectral response almost follows the Shallow3 spectral response in the blue range, but in the red range is much attenuated for the choice of K, resulting in a spectral response that essentially is responsive only to blue light, i.e. a blue spectral response.

Red Pixel

FIGS. 24-27 describe embodiments of the red pixel 14d.

Figure 24:
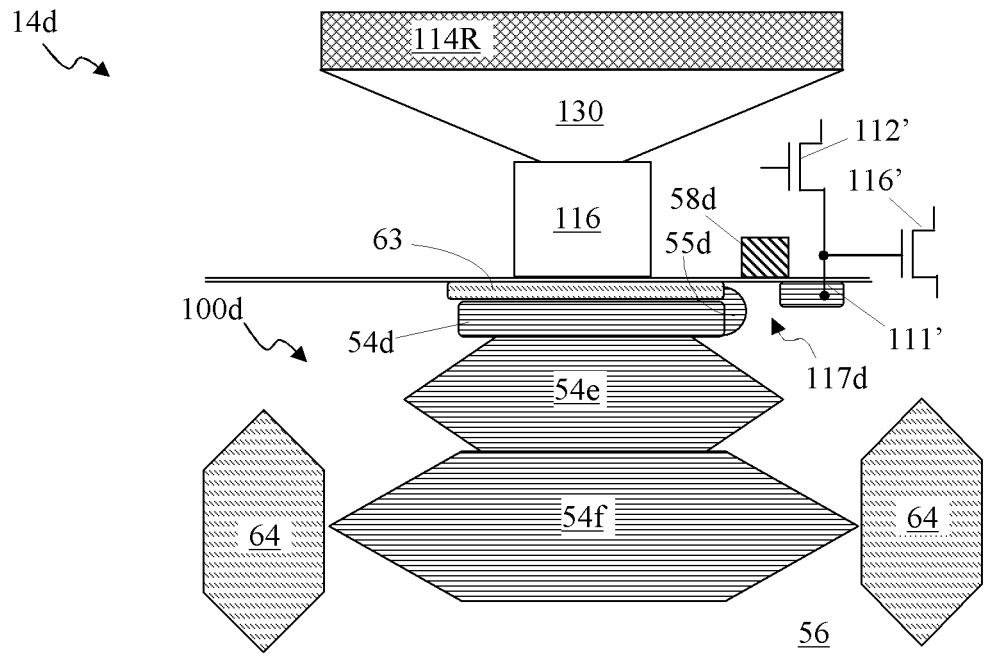
FIG. 24 shows a vertical section of an embodiment of a red pixel.

FIG. 24 shows a vertical section of an embodiment of a red pixel 14d according to the present invention. Photodiode 100d comprises multiple second regions 54d, 54e, 54f vertically stacked in the substrate 56 and mutually connected. The second regions 54d, 54e, 54f are of the second conductivity type. During charge integration, there is a continuous neutral region that continues across and connects all three second regions. The topmost second region 54d is below a surface first region 63 that prevents depletion region that grows from the topmost second region 54d from reaching the top interface of the substrate 56, which would have caused high leakage currents. Incident light from above the red pixel 14d is filtered by the red color filter 114R, continues through light guides 130, 116, and enters the second regions 54d, 54e, 54f.

The second regions 54d, 54e, 54f are electrically connected to transfer switch 117d by a connecting second region 55d of the second conductivity type. The transfer switch 117d comprises gate 58d and a drain diffusion (of the second conductivity type and at the interface) which is also the sensing node 111'. The sensing node 111' is further connected to output transistor 116' and reset switch 112' (shown only in symbols).

Although shown as a stack of three, the stack of connected second regions can comprise four, or five, or more connected second regions that, during charge integration, maintain electrical connection among them through a continuous neutral region that extends from within the bottommost second region to the topmost second region 54d. The bottommost second region preferably reaches a depth of between 1.5 μm to 3 μm.

Barrier regions 64, each on a side of the second regions 54e, 54f, each has a neutral region within itself that prevents depletion region that grows laterally from the second regions in the red pixel 14d from merging with depletion region from any one adjacent green 14a, 14c or magenta pixel 14b.

Figure 25:
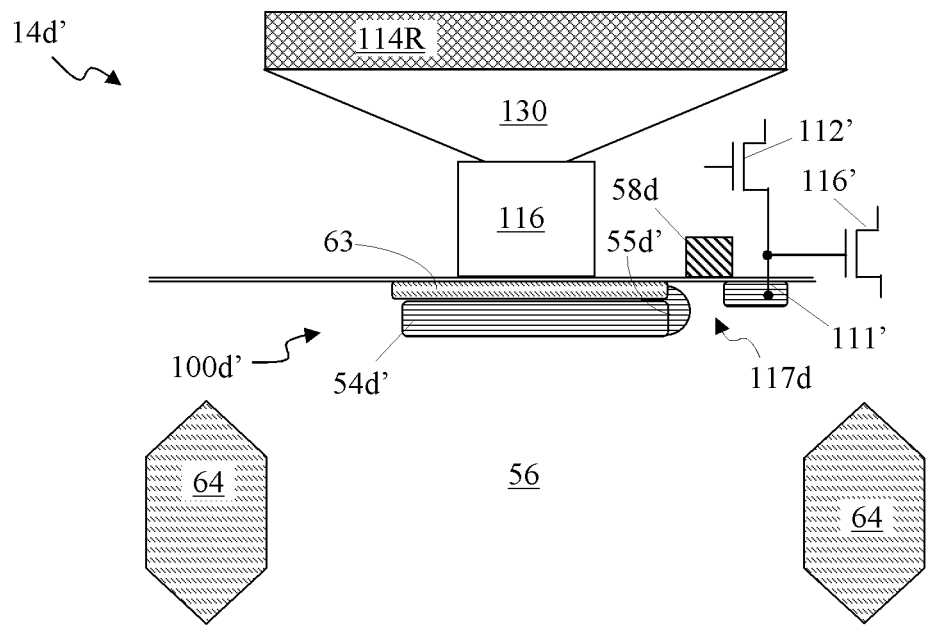
FIG. 25 shows a vertical section of an alternate embodiment of a red pixel.

FIG. 25 shows a vertical section of an alternate embodiment 14d' of a red pixel according to the present invention. The stack of second regions 54d, 54e, 54f is replaced with a second region 54d' just below the surface first region 63. The second region 54d' is connected to transfer switch 117d by a connecting second region 55d'. This embodiment 14d' may be constructed and operated as a pinned photodiode such that, during reset, when both the transfer switch 117d and the reset switch 112' are turned on, the second region 54d' and the connecting second region 55d' are fully depleted of electrons. Second region 55d' preferably reaches no further than 1 μm in depth into the substrate 56 in order to ensure full depletion under reverse bias of 3 volts or less across the photodiode. Barrier regions 64 generate lateral electric fields that push electrons laterally towards the region centered below the second region 54d, reducing inter-pixel crosstalk.

Figure 26:
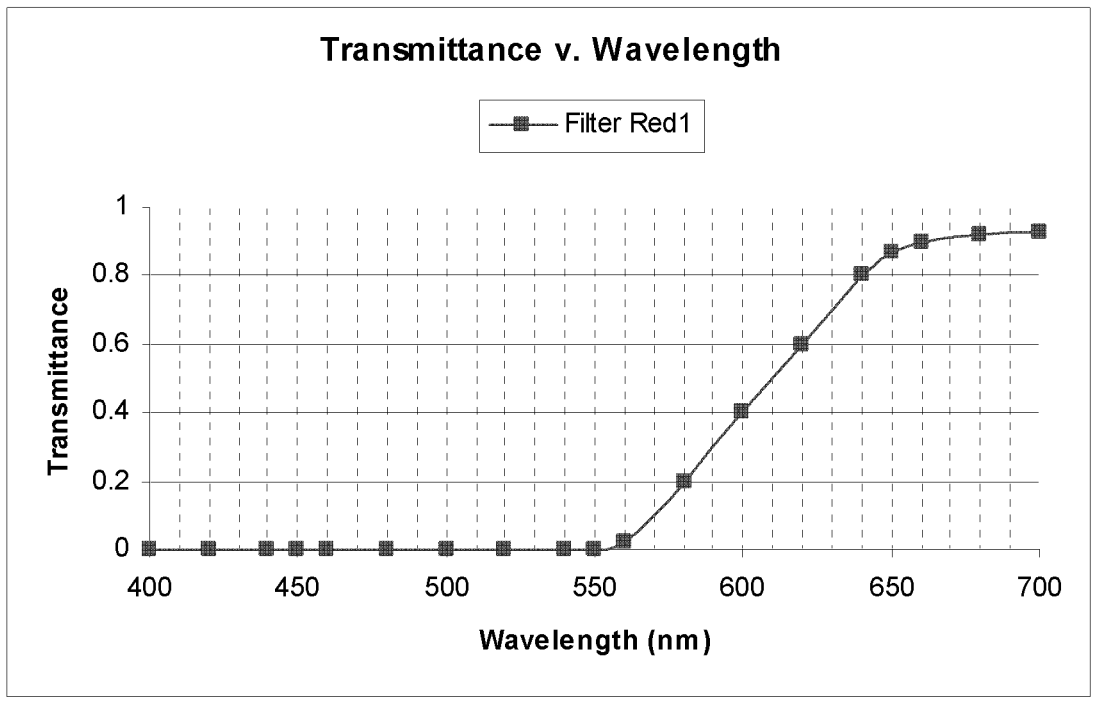
FIG. 26 is a graph that shows transmittance of light of a first red color filter as a function of wavelength of light in air.

FIG. 26 is a graph that shows transmittance of light of a first red color filter as a function of wavelength of light.

Figure 27:
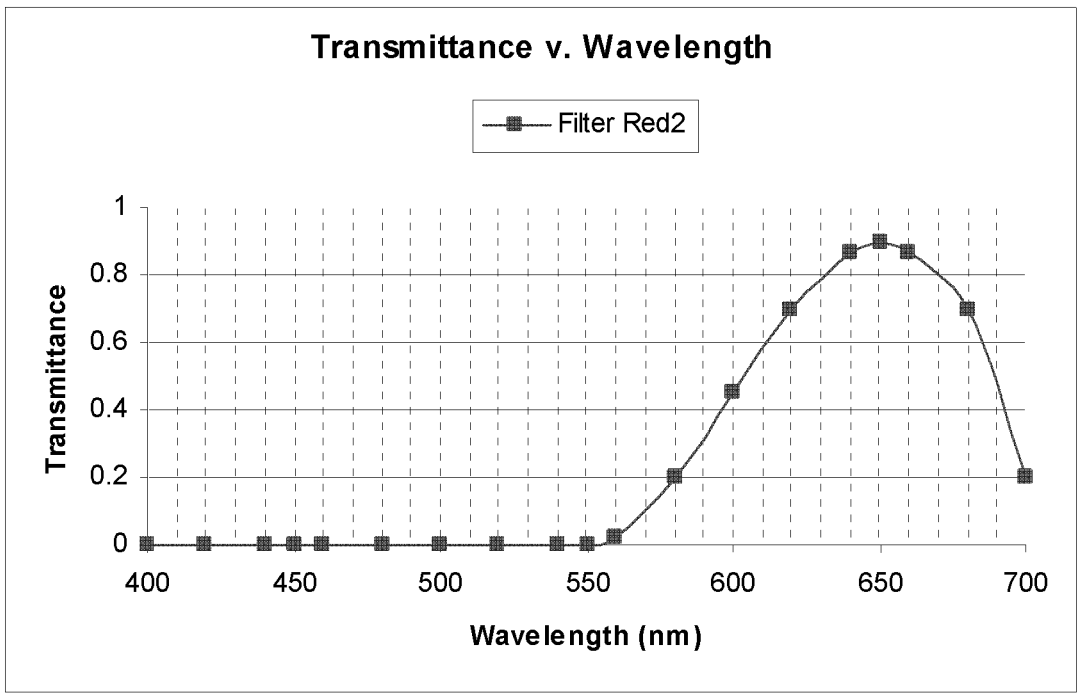
FIG. 27 is a graph that shows transmittance of light of a second red color filter as a function of wavelength of light in air.

FIG. 27 is a graph that shows transmittance of light of a second red color filter as a function of wavelength of light.

Generating Red Pixel Value for Magenta Pixel

Figure 34:
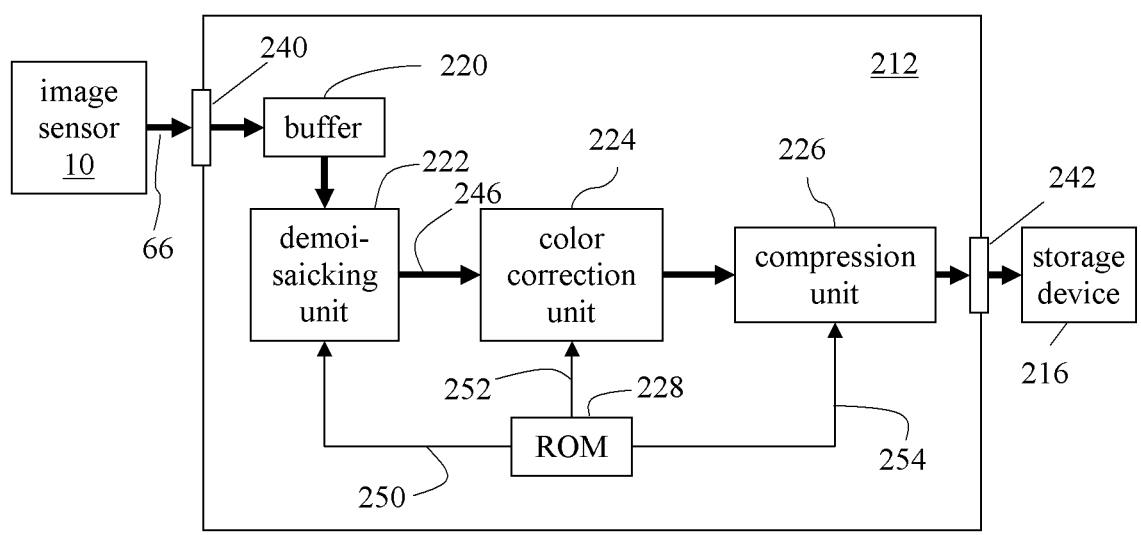
FIG. 34 is a block diagram of a camera processor.

FIG. 34 is a block diagram of a camera processor 212. The processor 212 receives a mosaic image generated from the pixel array 12 of the image sensor via a bus interface 240. The bus interface 240 may be a serial interface that receives one data bit at a time from image data generated from the image sensor 10, or a parallel interface that receives all data bits of a pixel simultaneously. Alternatively, a hybrid interface that receives two or more bits of a pixel at one moment in time from the bus 66 and another one or more bits of the pixel at a different moment in time. The mosaic image data is stored in buffer 220. The processor may have a DMA controller that controls transfer of the mosaic image data to and from a memory (not shown) outside the processor 212 for storing large amount of image data. The buffer outputs mosaic image data to a demosaicking unit 222. The demosaicking unit 222 generates missing colors for the mosaic image. A color correction unit 224 performs color correction on the color-interpolated image output by the demosaicking unit 222. There camera processor 212 may comprise a white balance correction unit (not shown) to correct the image to a better white balance. An image compression unit 226 receives a color image and performs image compression to produce a compressed imaged that has a reduced amount of image data. The compressed image is eventually stored into a storage device 216 via a data bus connected to the camera processor 212 at an output interface 242.

From the pixel array 12, a mosaic image is generated that comprises a plurality of red image pixels, a plurality of green image pixels and a plurality of magenta image pixels in an arrangement as shown in either FIG. 5A or FIG. 5B. This mosaic image may be received by the processor 212 shown in FIG. 34 from the image sensor 10 via bus 66 and bus interface 240 into a buffer 220, and subsequently processed by demosaicking unit 222 to reconstruct a full-color image. The demosaicking unit 222 outputs the full-color image on bus 246. In the mosaic image, each of the red image pixels has a red pixel value but has no blue or green pixel value. Each of the green image pixels has a green pixel value but no blue or red pixel value. Each of the magenta image pixels has a shallow photodiode value generated from a corresponding shallow photodiode 100e and a deep photodiode value generated from a corresponding deep photodiode 100b. The shallow photodiode value has a strong blue spectral response. The deep photodiode value has a predominantly red spectral response that is less than half as strong as that of the red image pixel value. To reconstruct a full-color image from the mosaic image, color interpolation methods may be employed in the demosaicking unit 222 to generate red and blue image pixel values for the green image pixels, and to generate blue and green pixel image values for the red image pixels.

For the magenta image pixel, its blue image pixel value may be generated by the demosaicking unit 222 by a weighted difference between the shallow photodiode signal and the deep photodiode signal as discussed above in the generation of composite signals Shallow1−K·Deep1, Shallow2−K·Deep2 and Shallow3−K·Deep3 with K selected in such a way that the composite signal has negligible red response. Alternatively, the composite signal formed as such, which has predominantly blue response and negligible red response, may be formed in the image sensor 10 and provided to the processor 212 in lieu of the shallow photodiode signal.

Generating a red image pixel value for the magenta image pixel solely from a deep photodiode signal D generated from a deep photodiode 100b, on the other hand, has major drawbacks. Doing so makes the resultant full-color image suffer from pixel-to-pixel non-uniformity in the red channel due to differences in spectral response between the photodiode 100d of the red pixel and the deep photodiode 100b of the magenta pixel. Additionally, in the red range, the deep photodiode

100b has far weaker peak spectral response than the red pixel photodiode 100d, giving rise to poorer SNR in the deep photodiode signal D. But neither is it appropriate to generate the red pixel value for the magenta image pixel by interpolating from neighboring red image pixels (and possibly neighboring green pixels as well) without taking into account the deep photodiode signal.

An aspect of the present invention is to provide a method to generate a red pixel value R for the magenta pixel using the deep photodiode signal D without the above drawbacks.

FIGS. 28-33 describe how a red pixel value may be generated for the magenta pixel 14b, 14b', 14b".

It is observed that if a color interpolation (i.e. demosaicking) from the neighboring image pixels (of the magenta image pixel) in the mosaic image results in an interpolated red pixel value Y for the magenta image pixel (that corresponds to the magenta pixel 14b in the pixel array 12) that is close enough to a red pixel value generated solely from the deep photodiode signal D, then selecting or preferring the interpolated red pixel value Y is appropriate, since the resultant SNR and color uniformity are better and since the difference between the two red pixel values is likely due to noise, predominantly due to having to amplify the deep photodiode signal, which is weak, along its propagation from the deep photodiode 100b.

It is also observed that where there are two (or more) possible interpolated red pixel values Y and Z for the magenta image pixel, if the red pixel value to be generated solely from the deep photodiode signal D is close enough to one of the interpolated red pixel values, then the closest interpolated red pixel value should be selected (or preferred), since again the difference is likely due to noise.

It is further observed that, on the other hand, if not even one interpolated red pixel value is close enough, then the red pixel value generated solely from the deep photodiode signal D should be selected (or preferred).

In all of the above observations, an interpolated red pixel value Y (or Z) is considered close enough to the red pixel value generated solely from the deep photodiode signal D if the difference between them is within a predetermined multiple of noise standard deviation $\sigma_D$ of the latter. For example, the multiple may be 2.5, such that when an interpolated red pixel value is within 2.5 times $\sigma_D$ of the deep photodiode signal D then the interpolated red pixel value is either selected or preferred (such as being given a higher weight in a weighted average to generate the red pixel value for the magenta pixel), whereas if the opposite is true then the interpolated red pixel value is either not selected or given a lesser preference (such as being given a lesser weight in the weighted average). Note that the noise standard deviation $\sigma_D$ may be a function of the deep photodiode signal D and of amplification gain along the signal path of the deep photodiode signal D.

In other words, the generated red pixel value R for the magenta pixel should follow the deep photodiode signal D less when the deep photodiode signal D alone would indicate a red pixel value close enough to an interpolated red pixel value Y, but should follow the deep photodiode signal D more when the opposite is true.

In terms of measurable input/output parameters of the demosaicking unit 222, in the method of this aspect of the present invention, the magenta pixel's generated red pixel value R is a function of at least the deep photodiode signal D and a red pixel value of an adjacent red image pixel such that a derivative of the magenta pixel's generated red pixel value R with respect to the deep photodiode signal D has at least one minimum. In the vicinity of this minimum, variations of the generated red pixel value R for the magenta pixel varies less with the deep photodiode signal D (i.e. does not follow the deep photodiode signal D as much) than farther from this minimum. With the help of this minimum, the generated red pixel value R at and near this minimum has less noise contribution from the deep photodiode. Furthermore, as a result of this minimum, the generated red pixel value R at and near this minimum is more "controlled" by the interpolated red pixel value Y, resulting in less susceptibility to differences between the spectral response of the deep photodiode 100b and that of the adjacent red pixel photodiodes 100d. The location of this minimum within the range of the deep photodiode signal D should be a function of (i.e. should vary with) at least one red pixel value from an adjacent red image pixel in the mosaic image.

Viewing this in another way, in the method of this aspect of the present invention, the generated red pixel value R for a magenta image pixel plotted against the deep photodiode signal D exhibits a curve that has a flatter section (e.g. FIG. 29, signal R, between R value of 120 and 130) for a certain range of values of the generated red pixel value R such that the flatter section is flatter than the overall curve. In other words, in the flatter section, the generated red pixel value R should have a smaller derivative value within the flatter section than an average gradient across the entire curve. In this section, the generated red pixel value R is "reluctant" to change with the deep photodiode signal D. Furthermore, the location of this flatter section within the entire range of possible red pixel values should be a function of at least an adjacent (to the magenta image pixel) red image pixel's red pixel value. The location maybe a function of an adjacent green image pixel's green pixel value as well.

This method is illustrated with two examples below. For simplicity of illustration, the red pixel value that would be generated solely from the deep photodiode signal D is taken to be the deep photodiode signal D itself, where D is assumed to have been amplified in such a way that its peak response in the red range is equal to or nearly equal to that of the red pixel value (and thus has a few times higher noise than the latter). It is also assumed, again for simplicity of illustration, that pre-distortion (such as gamma predistortion) has been performed on the deep photodiode signal D such that the relationship between the deep photodiode signal D and the red pixel value that would generate solely from the deep photodiode signal D is linear.

Figure 28:
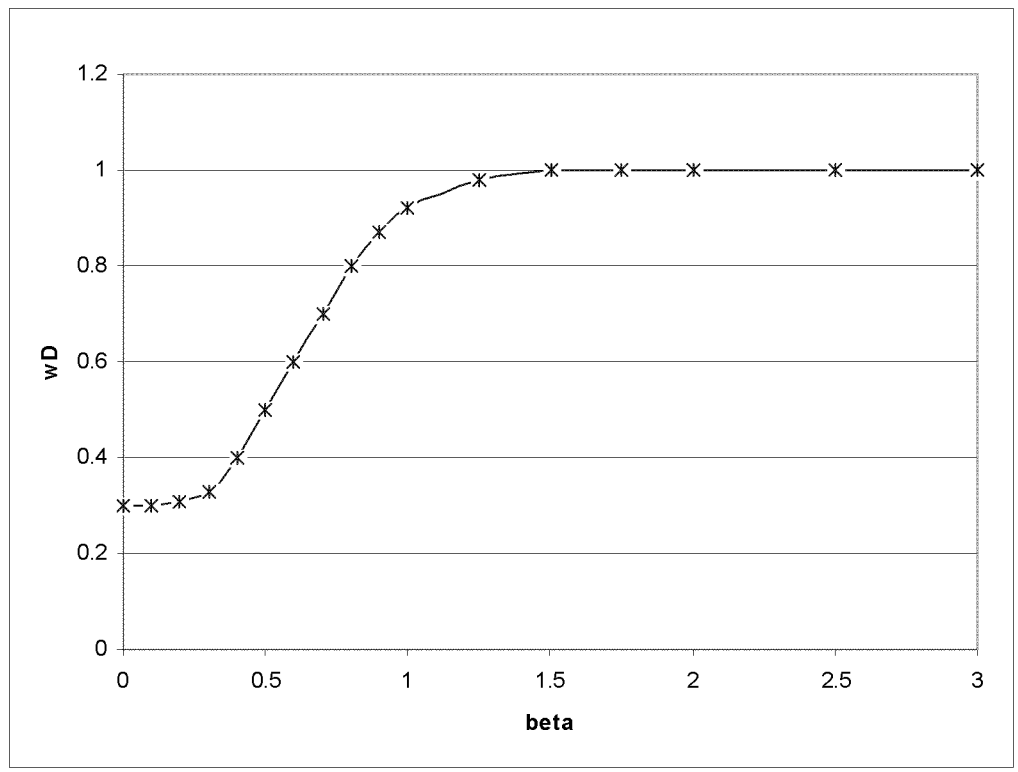
FIG. 28 is a graph that shows variation of weight $w_D$ for signal D, generated from the deep photodiode, as a function of beta, where beta measures a ratio of a difference between signal D and an interpolated signal Y that is independent of D to a multiple of a standard deviation of the noise in D.

FIG. 28 is a graph that shows variation of an example of a weight $w_D$ for deep photodiode signal D, as a function of beta, where beta measures a ratio of a difference between the deep photodiode signal D and an interpolated signal Y that is independent of the deep photodiode signal D to a multiple of a standard deviation of the noise in the deep photodiode signal D. (beta=$1/a \cdot |Y-D|/\sigma_D$, where $a \geq 1$).

Figure 29:
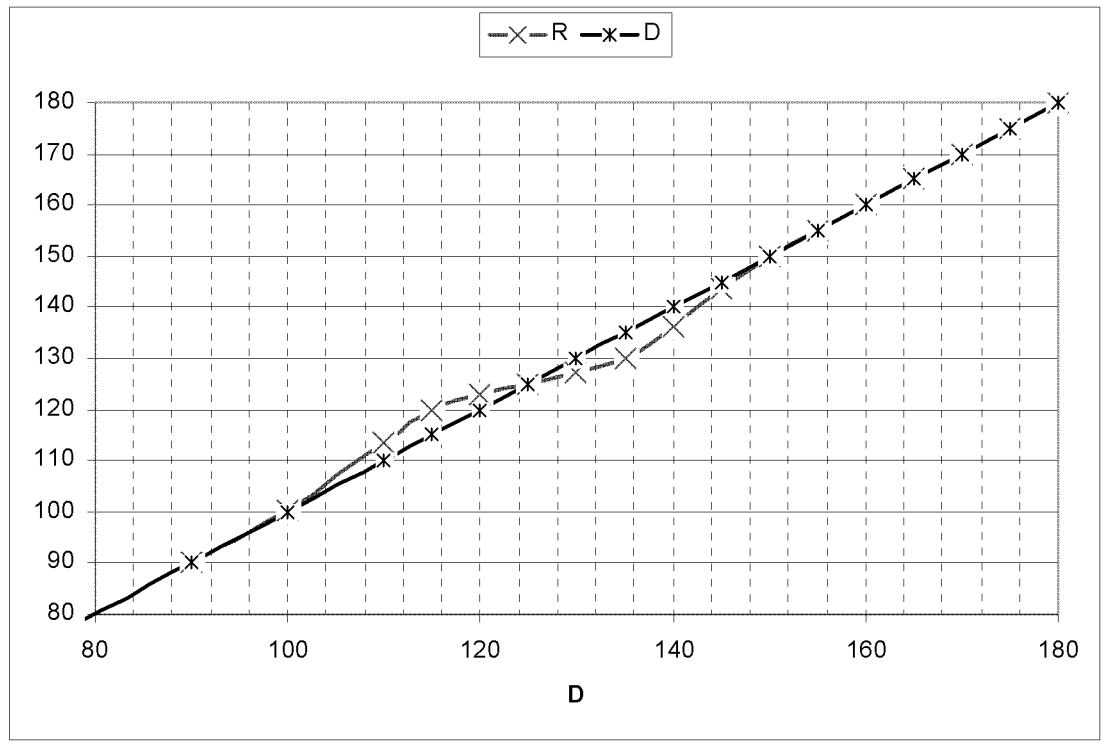
FIG. 29 is a graph that shows a relationship between the deep photodiode signal D and the generated red pixel signal R for the magenta pixel that has one flatter section.

As a first illustration, the weight $w_D$ shown in FIG. 28 is applied to deep photodiode signal D whereas $(1-w_D)$ is applied to the interpolated red pixel value Y. Namely, $R = w_D \cdot D + (1-w_D) \cdot Y$, where R is the generated red pixel value for the magenta image pixel. It is assumed that only a single interpolated red pixel value exists for the magenta image pixel for the given pixel values of neighboring image pixels. FIG. 29 is a graph that shows a relationship between the deep photodiode signal D and the generated red pixel signal R for the magenta image pixel. The interpolated red pixel value Y is fixed at 125. $a \cdot \sigma_D$ is 20. The deep-photodiode signal D is varied. This graph shows that where $|Y-D|$ is less than 15 (thus resulting in beta=$1/a \cdot |Y-D|/\sigma_D < 0.75$), the red pixel value R generated for the magenta image pixel is pulled towards the interpolated value Y, i.e. 125, whereas otherwise it varies faster with the deep-photodiode signal D. In terms of the weight $w_D$ as displayed in the graph of FIG. 28, this can be understood as follows. As beta falls below 0.75, the contribution of the deep photodiode signal D towards the generated red pixel value of the magenta image pixel decreases towards 0.3 whereas that of the interpolated pixel value Y increases towards 0.7.

Figure 30:
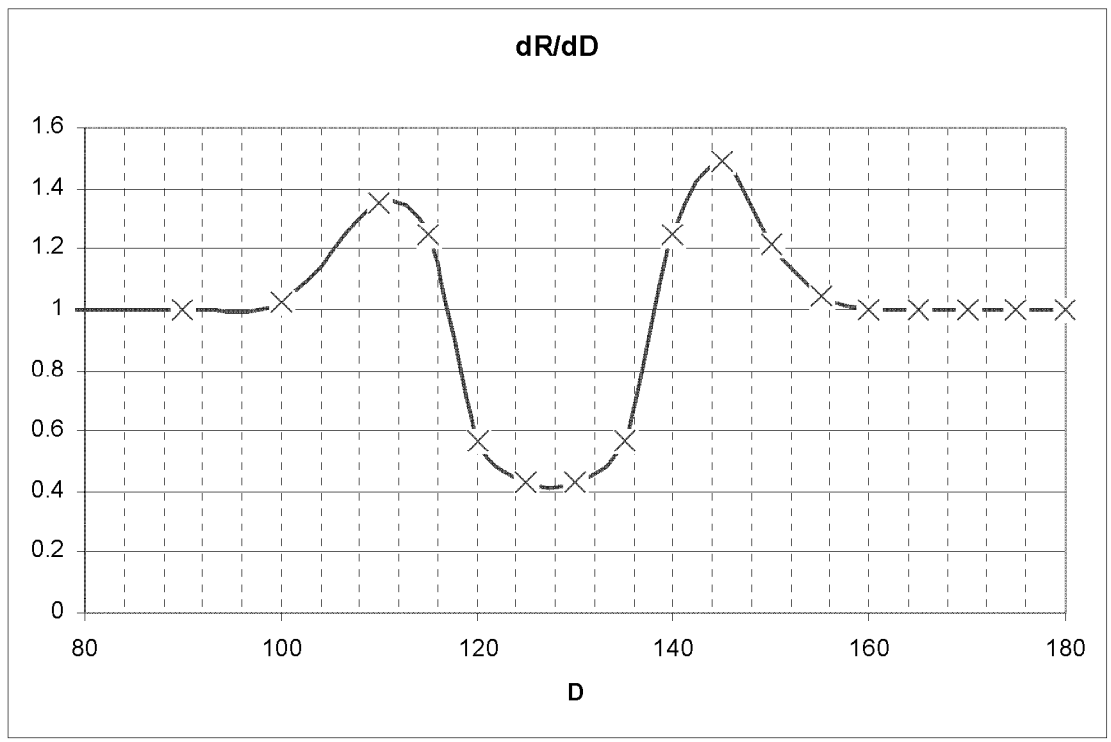
FIG. 30 is a graph that shows a derivative of the red pixel signal R of FIG. 29 with respect to the deep photodiode signal D.

FIG. 30 is a graph that shows a derivative of the red pixel signal R of FIG. 29 with respect to the deep photodiode signal D. The derivative has a minimum value of 0.4 at D=125. Far away from the minimum, such as D>160 or D<100, the derivative assumes an essentially constant, higher value of 1. Note that, if the deep photodiode signal D as received by the demosaicking unit 222 is not predistorted whereas the generated red pixel value needs to be predistorted then at the upper end of the range of the red pixel value Y the derivative would gradually reduce again. Further note that the derivative may have a different value than 1 if the deep photodiode signal D as received by the demosaicking unit 222 is not pre-amplified to match its spectral response in the red range to the red pixel value of red pixels or if the mosaic image's pixel value signals occupy different range than the reconstructed full-color image output by the demosaicking unit 222.

Figure 31:
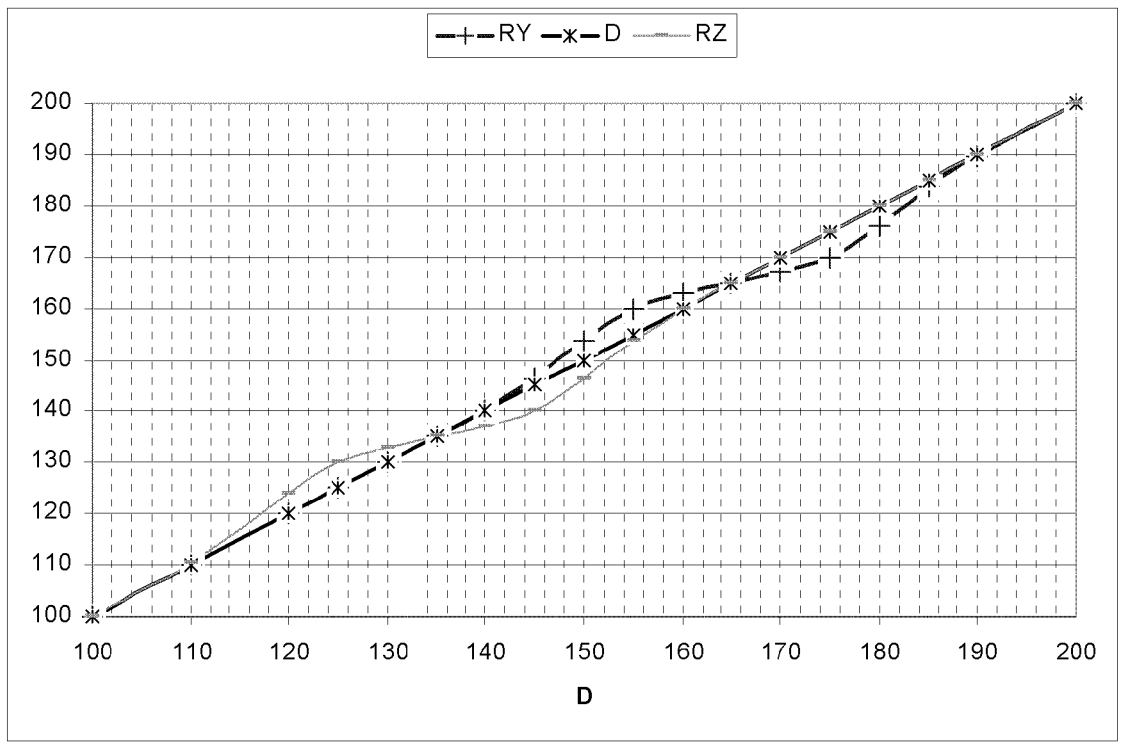
FIG. 31 is a graph that shows a relationship between the deep photodiode signal D, a first red pixel signal RY and a second red pixel signal RZ.
Figure 32:
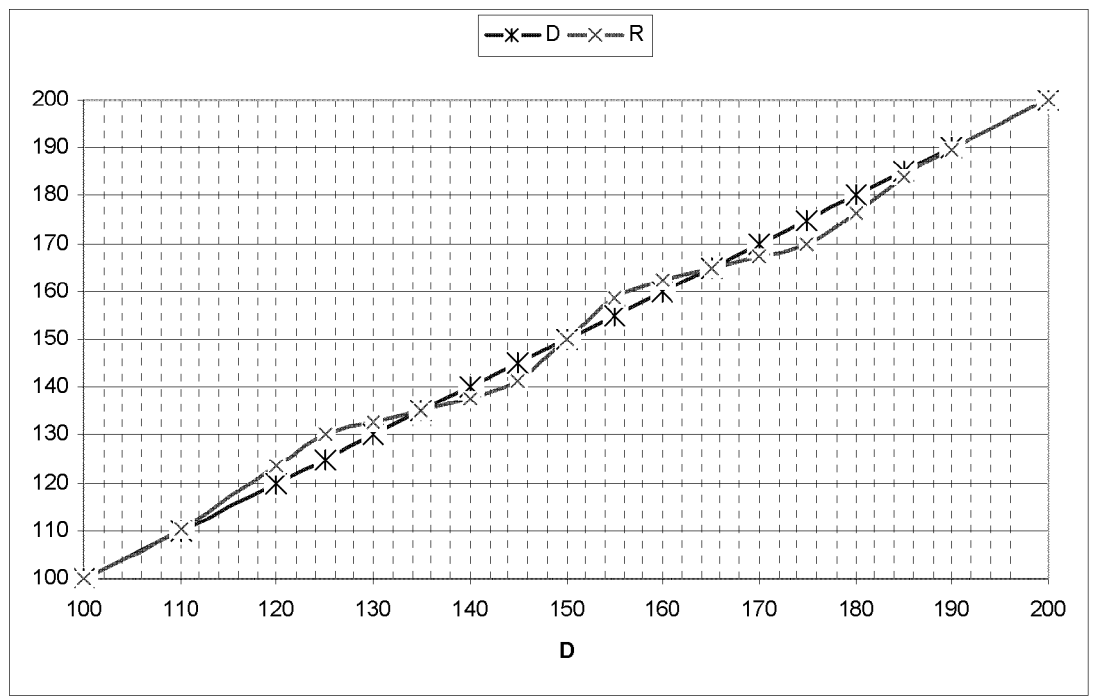
FIG. 32 is a graph that shows a relationship between the deep photodiode signal D and the generated red pixel signal R that has two different flatter sections.
Figure 33:
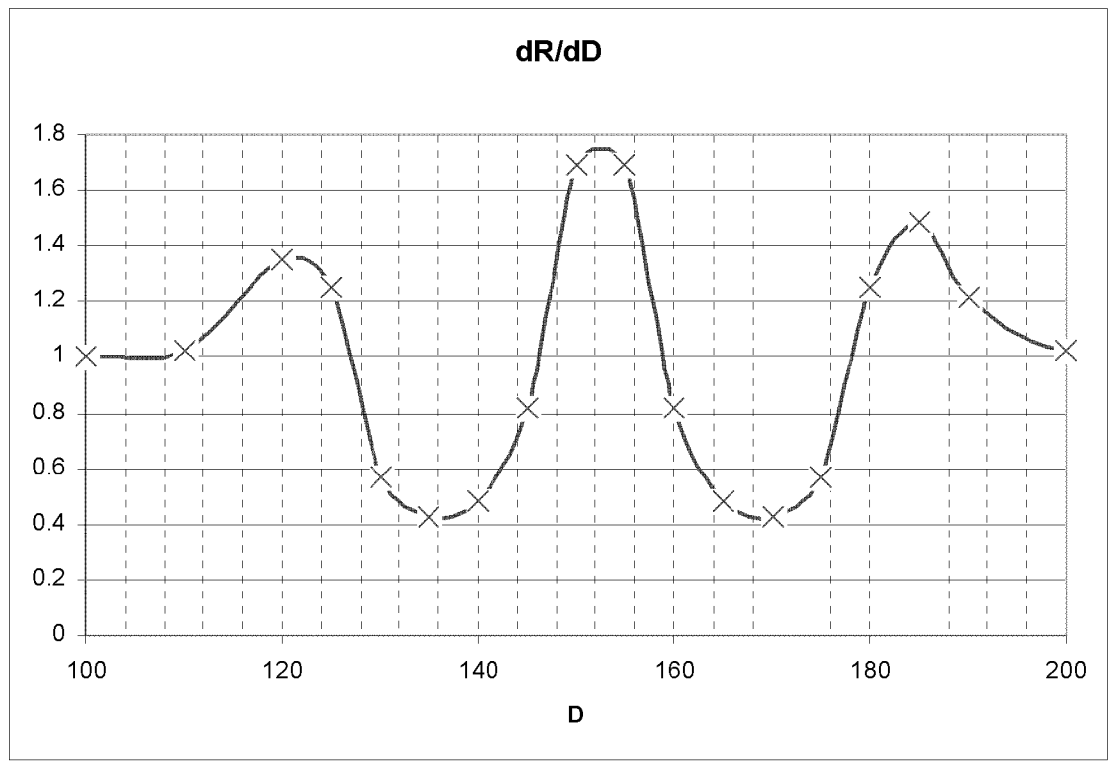
FIG. 33 is a graph that shows a derivative of the red pixel signal of FIG. 28 with respect to the deep photodiode signal D.

As a second illustration, FIGS. 31 to 33 describe how two different interpolated values, Y and Z, may be used along with the deep photodiode signal D to generate the red pixel value R for the magenta pixel. In this illustration, Y is 165, Z is 135, and $a \cdot \sigma_D$ is 20.

FIG. 31 is a graph that shows a relationship between the deep photodiode signal D, a first red pixel signal RY and a second red pixel signal RZ. The first red pixel signal RY shows how the generated red pixel value for the magenta image pixel would behave for a given set of pixel values of neighboring pixels of the magenta image pixel if only one interpolated pixel value is accounted for like in the first illustration, the interpolated pixel value being Y. The second red pixel signal RZ, on the other hand, is for Z. This graph shows that, RY and RZ, respectively, are "reluctant" to change in the vicinity of Y and Z, respectively.

According to this aspect of the invention, however, the generated red pixel should exhibit such "reluctance" (i.e. flatter section) at two places. This can be achieved by forming the red pixel value R according to this expression:

$$R = w_{DY} \cdot w_{DZ} \cdot D + (1 - w_{DY} \cdot w_{DZ}) * [(1 - w_{DY}) \cdot Y + (1 - w_{DZ}) \cdot Z] / (2 - w_{DY} - w_{DZ}),$$

where $w_{DY}$ is the $w_D$ function of FIG. 28 with the interpolated signal being Y, and $w_{DY}$ is the $w_D$ function of FIG. 28 with the interpolated signal being Z.

FIG. 32 is a graph that shows a relationship between the deep photodiode signal D and the generated red pixel signal R that has two different flatter sections. A lower flatter section is seen between red values of 130 and 140. A higher flatter section is seen between red values of 160 and 170. It is clear that, within these two flatter sections, noise from the deep photodiode 100b is attenuated compared to outside these flatter sections, since the generated red pixel value R within these flatter sections varies less with the deep photodiode signal D than outside.

FIG. 33 is a graph that shows a derivative of the red pixel signal R of FIG. 28 with respect to the deep photodiode signal D. The derivate attains a minimum level of 0.4 at values of the deep photodiode signal D of approximately 135 and 170, respectively.

Generating Blue Pixel Value for Magenta Pixel

A simple method for generating a blue pixel value for the magenta pixel has been described above with reference to FIG. 14 comprises forming a weighted difference between the shallow photodiode signal and the deep photodiode signal.

In an alternative embodiment, the blue pixel value may be formed by replacing the deep photodiode signal with the Red pixel signal R.

Closing Remarks

Although FIG. 34 shows the demosaicking unit 222 being in the processor 212, in an alternate embodiment it may be part of the image sensor 10 and receives digitized image data generated from the pixel array 12 via output bus 66 of the ADC 24 and output the reconstructed full-color image on a different bus.

The demosaicking unit 222 may generate only the red pixel value R for magenta pixels instead of generating all missing colors for all green, red and magenta pixels. It may instead provide the generated red pixel values of magenta pixels on a bus whereas a different demosaicking circuit generates one or more of the other missing colors. Ultimately, all the generated missing colors are assembled together with the colors in the mosaic image to form a full-color image.

Although the reconstructed full-color image is shown to be sent to a color correction unit 224 in FIG. 34, other modifications known in the art may be arranged. For example, the generated red pixel values for magenta pixels may be stored in the storage device 216, and subsequently assembled together with the other colors (including the other missing colors of the mosaic image) by a computing device to form a reconstructed full-color image.

A nonvolatile memory, which may be external to the camera processor 212 or may be part of it, such as the Read-Only Memory (ROM) 228 shown in FIG. 34, may store instructions to cause the demosaicking unit 222 to perform according to any or all of the methods described in this disclosure.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for forming color images, comprising:
    forming a color image from a mosaic image, the mosaic image comprising a red image pixel and a magenta image pixel, the red image pixel comprising a first signal with a first essentially red spectral response from a first photodetector that receives light through a red color filter, the magenta image pixel comprising a second signal with a second essentially red spectral response from a second photodetector that receives light through a magenta color filter adjacent to the red color filter, said forming the color image comprising:
        generating a third signal to represent red color for the magenta image pixel as a function of at least the first and second signals.

2. The method of claim 1, wherein a magnitude of a derivative of the third signal with respect to the second signal has a minimum.

3. The method of claim 2, wherein a location of the minimum within a range of the second signal varies with the first signal.

4. The method of claim 3, wherein the magnitude varies by at least two times between the minimum and where the magnitude is largest.

5. The method of claim 2, wherein a derivative of the third signal with respect to the first signal is larger if the second signal attains the minimum than if the second signal is in a different state.

6. The method of claim 1, wherein the magenta image pixel further has a fourth signal with an essentially magenta spectral response, further comprising:

subtracting a first multiple of the second signal from a second multiple of the fourth signal to form a fifth signal to represent blue color for the magenta image pixel.

7. The method of claim 1, wherein the magenta image pixel further has a fourth signal with an essentially magenta spectral response, further comprising:

subtracting a first multiple of the third signal from a second multiple of the fourth signal to form a fifth signal to represent blue color for the magenta image pixel.

8. A camera processor, comprising:

a demosaicking unit that performs the method according to claim 1 on the mosaic image to generate the color image;

an input interface configured to receive image data of the mosaic image from an image sensor.

9. A non-transitory nonvolatile computer data storage medium carrying computer-readable instructions, which when executed by a computing device cause the computing device to perform the method according to claim 1.

10. An image capture apparatus, comprising:

a lens;

an image sensor pixel array configured to receive light that passes through the lens and generate the mosaic image of claim 1, the image sensor pixel array comprising:

a pair of green color filters arrayed in a first direction;

the red color filter adjacent to both green color filters of the pair; and the magenta color filter adjacent to both green color filters of the pair and on an opposite side of the pair from the red color filter; and a demosaicking unit that has a configuration to perform the method according to claim 1 on the mosaic image to generate the color image.

11. The image capture apparatus of claim 10, wherein a magnitude of a derivative of the third signal with respect to the second signal has a minimum.

12. The image capture apparatus of claim 11, wherein a location of the minimum within a range of the second signal varies with the first signal.

13. The image capture apparatus of claim 12, wherein the magnitude varies by at least two times between the minimum and where the magnitude is largest.

14. The image capture apparatus of claim 13, wherein a derivative of the third signal with respect to the first signal is larger if the second signal attains the minimum than if the second signal is in a different state.

15. The image capture apparatus of claim 10, wherein the magenta image pixel further has a fourth signal that has an essentially magenta spectral response, further comprising:

subtracting a first multiple of the second signal from a second multiple of the fourth signal to form a fifth signal to represent blue color for the magenta image pixel.

16. The image capture apparatus of claim 10, wherein the magenta image pixel further has a fourth signal that has an essentially magenta spectral response, further comprising:

subtracting a first multiple of the third signal from a second multiple of the fourth signal to form a fifth signal to represent blue color for the magenta image pixel.

* * * * *